(12) United States Patent
Ahn et al.

(10) Patent No.: US 10,867,923 B2
(45) Date of Patent: Dec. 15, 2020

(54) SEMICONDUCTOR DEVICE

(71) Applicant: SAMSUNG ELECTRONICS CO., LTD., Suwon-si (KR)

(72) Inventors: Sang Hoon Ahn, Goyang-si (KR); Tae Soo Kim, Bucheon-si (KR); Jong Min Baek, Seoul (KR); Woo Kyung You, Incheon (KR); Thomas Oszinda, Hwaseong-si (KR); Byung Hee Kim, Seoul (KR); Nae In Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/135,234

(22) Filed: Sep. 19, 2018

(65) Prior Publication Data

US 2019/0019759 A1 Jan. 17, 2019

Related U.S. Application Data

(63) Continuation of application No. 15/333,508, filed on Oct. 25, 2016, now abandoned.

(30) Foreign Application Priority Data

Jan. 27, 2016 (KR) .................. 10-2016-0010200

(51) Int. Cl.
| | |
|---|---|
| *H01L 23/532* | (2006.01) |
| *H01L 21/768* | (2006.01) |
| *H01L 23/482* | (2006.01) |
| *H01L 23/522* | (2006.01) |

(52) U.S. Cl.
CPC .... *H01L 23/53295* (2013.01); *H01L 21/7682* (2013.01); *H01L 23/4821* (2013.01); *H01L 23/5329* (2013.01); *H01L 23/5222* (2013.01); *H01L 23/53223* (2013.01); *H01L 23/53238* (2013.01); *H01L 23/53266* (2013.01); *H01L 2221/1042* (2013.01)

(58) Field of Classification Search
CPC ......... H01L 2221/1042; H01L 21/7682; H01L 23/4821; H01L 23/5329; H01L 23/53295
See application file for complete search history.

(56) References Cited

U.S. PATENT DOCUMENTS

| | | |
|---|---|---|
| 4,933,743 A | 6/1990 | Thomas et al. |
| 5,148,260 A | 9/1992 | Inoue et al. |
| 5,798,559 A | 8/1998 | Bothra et al. |
| 6,204,165 B1 | 3/2001 | Ghoshal |
| 6,255,712 B1 | 7/2001 | Clevenger et al. |
| 6,498,112 B1 * | 12/2002 | Martin .............. H01L 21/02126 438/763 |
| 6,596,624 B1 | 7/2003 | Romankiw |

(Continued)

FOREIGN PATENT DOCUMENTS

JP 2015-167180 A 9/2015

*Primary Examiner* — David A Zarneke
(74) *Attorney, Agent, or Firm* — Lee IP Law, P.C.

(57) ABSTRACT

A semiconductor device includes an element layer, a plurality of first interconnect lines on the element layer, a first insulation layer including carbon having a uniform concentration distribution between the first interconnect lines, a plurality of second interconnect lines spaced from the first interconnect lines, and a second insulation layer between the second interconnect lines. An air spacing is included between the second interconnect lines.

8 Claims, 20 Drawing Sheets

(56) References Cited

U.S. PATENT DOCUMENTS

| | | | |
|---|---|---|---|
| 6,707,156 B2 | 3/2004 | Suzuki et al. | |
| 6,713,835 B1 | 3/2004 | Horak et al. | |
| 6,815,329 B2* | 11/2004 | Babich | H01L 21/7681 257/E21.579 |
| 7,042,095 B2* | 5/2006 | Noguchi | H01L 21/76801 257/203 |
| 7,078,336 B2 | 7/2006 | Cheng et al. | |
| 7,244,673 B2 | 7/2007 | Huang et al. | |
| 7,250,679 B2 | 7/2007 | Otsuka | |
| 7,250,681 B2 | 7/2007 | Matsunaga | |
| 7,285,474 B2 | 10/2007 | Anderson et al. | |
| 7,304,388 B2 | 12/2007 | Dubin et al. | |
| 7,553,756 B2* | 6/2009 | Hayashi | H01L 21/76802 257/522 |
| 7,795,142 B2* | 9/2010 | Masuda | H01L 21/3105 438/672 |
| 7,838,440 B2* | 11/2010 | Park | H01L 21/76835 438/780 |
| 7,944,053 B2* | 5/2011 | Usui | H01L 21/7682 257/751 |
| 8,048,796 B2* | 11/2011 | Seidel | H01L 21/76804 438/618 |
| 8,080,878 B2* | 12/2011 | Ueki | H01L 21/02216 257/759 |
| 8,258,630 B2 | 9/2012 | Yokoi | |
| 8,290,135 B2* | 10/2012 | Oliver | H04L 63/105 379/202.01 |
| 8,390,135 B2* | 3/2013 | Oka | H01L 21/02126 257/288 |
| 8,420,528 B2* | 4/2013 | Noguchi | H01L 21/76811 257/386 |
| 8,502,388 B2* | 8/2013 | Seo | H01L 23/53295 257/774 |
| 8,652,962 B2 | 2/2014 | Singh et al. | |
| 8,710,660 B2 | 4/2014 | Yu et al. | |
| 8,779,590 B2 | 7/2014 | Isobayashi | |
| 9,034,756 B2* | 5/2015 | Tsai | H01L 21/76885 257/E21.158 |
| 9,070,690 B2* | 6/2015 | Suzumura | H01L 23/5384 |
| 9,343,400 B2* | 5/2016 | Lee | H01L 23/49827 |
| 9,373,586 B2 | 6/2016 | Lu et al. | |
| 9,449,811 B2* | 9/2016 | Hsiao | H01L 21/76877 |
| 9,627,316 B1 | 4/2017 | Chang et al. | |
| 9,728,447 B2 | 8/2017 | Lin | |
| 9,875,928 B2* | 1/2018 | Liou | H01L 21/7682 |
| 9,960,117 B2* | 5/2018 | Gates | H01L 21/28556 |
| 2002/0160563 A1 | 10/2002 | Ghoshal | |
| 2003/0183940 A1 | 10/2003 | Noguchi et al. | |
| 2005/0023699 A1 | 2/2005 | Ahn et al. | |
| 2006/0091559 A1* | 5/2006 | Nguyen | H01L 21/02216 257/775 |
| 2007/0045851 A1* | 3/2007 | Kitada | H01L 21/76846 257/758 |
| 2007/0278682 A1* | 12/2007 | Ko | H01L 23/5329 257/758 |
| 2009/0134517 A1* | 5/2009 | Usui | H01L 21/76831 257/751 |
| 2010/0130001 A1 | 5/2010 | Noguchi | |
| 2011/0204525 A1* | 8/2011 | Seo | H01L 21/7682 257/774 |
| 2014/0073128 A1* | 3/2014 | Jong | H01L 23/53266 438/643 |
| 2014/0131872 A1 | 5/2014 | Lu et al. | |
| 2014/0252624 A1* | 9/2014 | Huang | H01L 23/53223 257/751 |
| 2014/0252636 A1* | 9/2014 | Chen | H01L 23/5222 257/773 |
| 2014/0306344 A1 | 10/2014 | Sugawa et al. | |
| 2014/0349481 A1 | 11/2014 | Tsai et al. | |
| 2015/0187696 A1 | 7/2015 | Tsai et al. | |
| 2015/0287628 A1 | 10/2015 | You et al. | |
| 2016/0118335 A1 | 4/2016 | Lee et al. | |
| 2016/0247710 A1 | 8/2016 | Morita et al. | |
| 2016/0276260 A1 | 9/2016 | Liou et al. | |
| 2017/0365504 A1 | 12/2017 | Choi et al. | |
| 2020/0251418 A1* | 8/2020 | Lin | H01L 23/5226 |

* cited by examiner

SEMICONDUCTOR DEVICE

CROSS-REFERENCE TO RELATED APPLICATIONS

This is a continuation application based on pending application Ser. No. 15/333,508, filed Oct. 25, 2016, the entire contents of which is hereby incorporated by reference.

Korean Patent Application No. 10-2016-0010200, filed on Jan. 27, 2016, and entitled, "Semiconductor Device and Method of Manufacturing the Same," is incorporated by reference herein in its entirety.

BACKGROUND

1. Field

One or more embodiments described herein relate to a semiconductor device and a method for manufacturing a semiconductor device.

2. Description of the Related Art

The demand for improved performance, speed, and functionality has resulted in an increase in the integration of semiconductor devices. One approach for increasing integration involves reducing the width or separation distance of interconnect lines. However, this approach as increased in parasitic capacitance in many cases.

SUMMARY

In accordance with one or more embodiments, a semiconductor device includes an element layer; a plurality of first interconnect lines on the element layer, the first interconnect lines extending in a first direction; a first insulation layer between the first interconnect lines and having a uniform carbon concentration distribution; a plurality of second interconnect lines extending in the first direction and spaced from the first interconnect lines in a second direction different from the first direction; and a second insulation layer adjacent the second interconnect lines, wherein an air gap is between the second interconnect lines.

In accordance with one or more other embodiments, a semiconductor device includes a first region including a first plurality of interconnect layers and a first plurality of insulation layers having a first structure over a first transistor; a second region including a second plurality of interconnect layers and a second plurality of insulation layers having a second structure over a second transistor wherein: the first plurality of interconnect layers includes a plurality of first interconnect lines and a plurality of second interconnect lines, the first plurality of insulation layers includes a first insulation layer and a second insulation layer, the first insulation layer between the first interconnect lines and having a uniform carbon concentration distribution, the second insulation layer adjacent to the second interconnect lines, and a first air gap is between the second interconnect lines.

In accordance with one or more other embodiments, a method for manufacturing a semiconductor device includes forming a first insulation layer having a first opening on a substrate; forming first interconnect lines while filling the first opening with a conductive material; removing at least a portion of the first insulation layer to allow lateral surfaces of the first interconnect lines to be exposed; forming a first dielectric layer covering upper surfaces and lateral surfaces of the first interconnect lines; forming a second insulation layer extended upwardly while filling spacings between the first interconnect lines, on the first dielectric layer; forming a third insulation layer having a second opening above the second insulation layer; forming second interconnect lines while filling the second opening with a conductive material; removing at least a portion of the third insulation layer to allow lateral surfaces of the second interconnect lines to be exposed; and forming a fourth insulation layer having an air spacing, between the second interconnect lines.

BRIEF DESCRIPTION OF THE DRAWINGS

Features will become apparent to those of skill in the art by describing in detail exemplary embodiments with reference to the attached drawings in which.

DETAILED DESCRIPTION

Figure 1A:
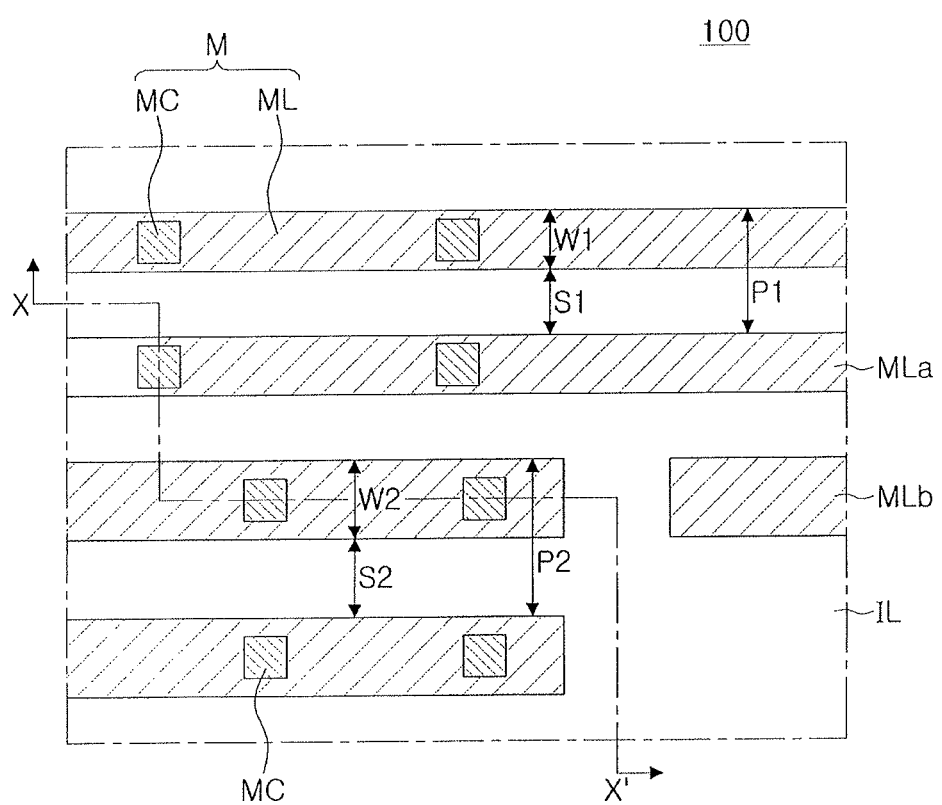
FIGS. 1A and 1B illustrate an embodiment of a semiconductor device.
Figure 1B:
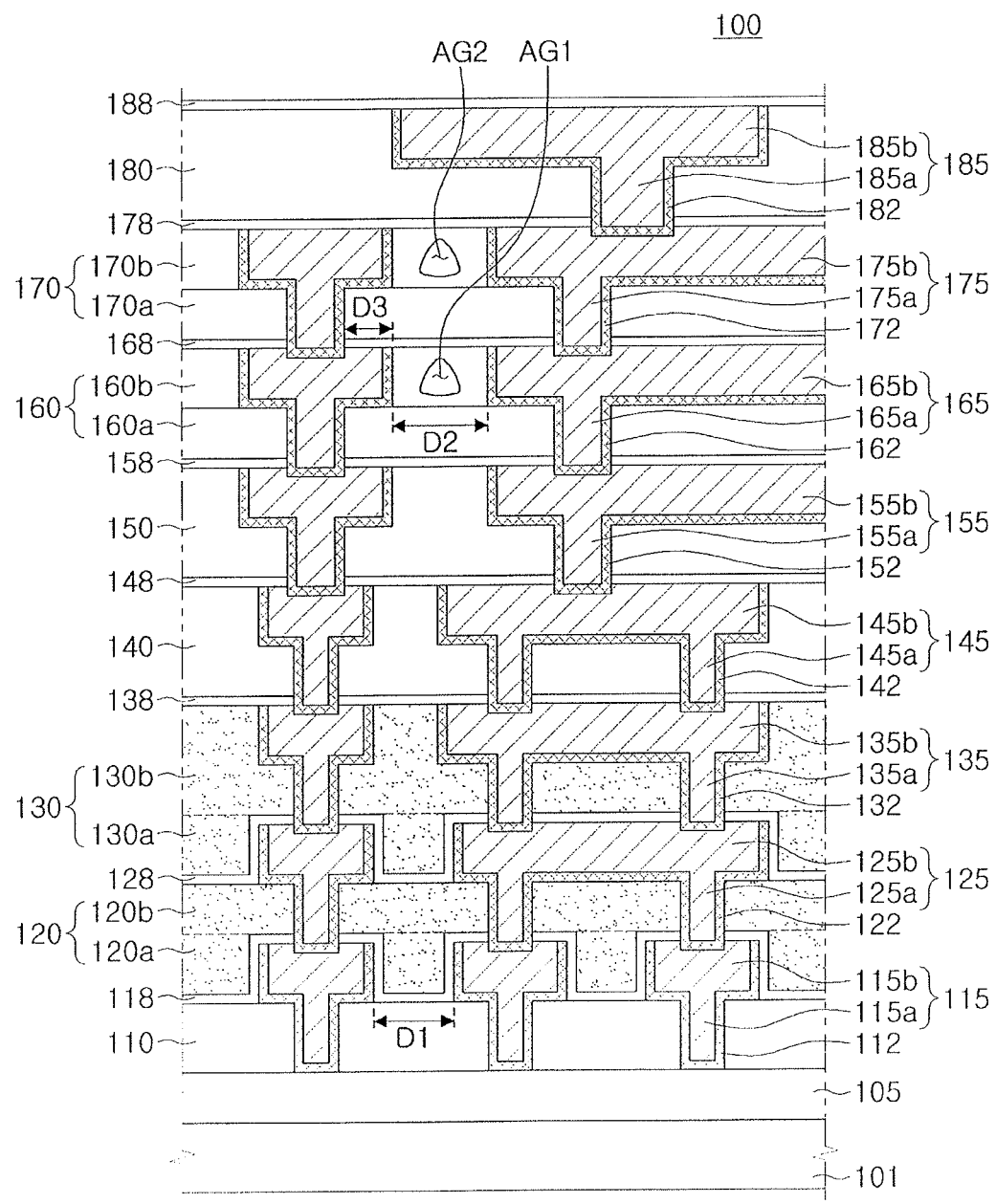

FIGS. 1A and 1B illustrate an embodiment of a semiconductor device 100. FIG. 1A is a layout view of the semiconductor device 100. The layout view has only one interconnect layer M (e.g., a second interconnect layer 125) among a plurality of interconnect layers M in FIG. 1B for ease of understanding. FIG. 1B illustrates a cross-sectional view of the semiconductor device 100 taken along line X-X' in FIG. 1A.

Referring to FIGS. 1A and 1B, the semiconductor device 100 may include a substrate 101, an element layer 105, first to eighth insulation layers 110, 120, 130, 140, 150, 160, 170, and 180 (insulation layers IL), and first to eighth interconnect layers 115, 125, 135, 145, 155, 165, 175, and 185 (interconnect layers M). The semiconductor device 100 may further include diffusion barrier layers 112, 122, 132, 142, 152, 162, 172, and 182 on lateral surfaces and lower surfaces of the respective interconnect layers M, and first to eighth dielectric layers 118, 128, 138, 148, 158, 168, 178, and 188 on upper surfaces of the interconnect layers M.

The substrate 101 may include a semiconductor material, for example, a Group IV semiconductor, a Group III-V compound semiconductor, or a Group II-VI compound semiconductor. The group IV semiconductor may include, for example, silicon, germanium, or silicon-germanium. The substrate 101 may be provided as a bulk wafer, an epitaxial layer, a silicon-on-insulator (SOI) layer, a semiconductor-on-insulator (SeOI) layer, or the like.

The element layer 105 may be on the substrate 101 and may include one or more semiconductor elements. The element layer 105 may include, for example, a transistor, a lower interconnect, an insulation layer, and/or other elements.

The first to eighth interconnect layers M may be on the element layer 105 and may include first to eighth interconnect lines 115b, 125b, 135b, 145b, 155b, 165b, 175b, and 185b (interconnect lines ML), and first to eighth contact plugs 115a, 125a, 135a, 145a, 155a, 165a, 175a, and 185a (contact plugs MC) connecting upper and lower interconnect lines ML to each other, respectively. The interconnect layers M are illustrated to have a dual damascene structure in which the interconnect lines ML and the contact plugs MC are integrally formed. In other embodiments, the interconnect layers M may have a structure in which the interconnect lines ML and the contact plugs MC are separately formed. In this case, the first to eighth dielectric layers 118, 128, 138, 148, 158, 168, 178, and 188 may not have a shape extended along surfaces of the interconnect lines ML, as illustrated in FIG. 1B. In addition, the number of the interconnect layers M may be different in other embodiments.

The interconnect layers M may be formed, for example, of a low resistance conductive material such as copper (Cu), tungsten (W), or aluminum (Al). As illustrated in FIG. 1A, each of the interconnect lines ML may include interconnect patterns MLa and MLb having a large range of pitches. A first interconnect pattern MLa may have a first width W1 with a first space S1 and may have a first pitch P1, which corresponds to the sum of the first width W1 and the first space S1.

The second interconnect pattern MLb may have a second width W2 with a second space S2. The second width W2 may be greater than the first width W1, and the second space S2 may be equal to or greater than the first space S1. The second interconnect pattern MLb may also have a second pitch P2 which is greater than the first pitch P1 and which corresponds to a sum of the second width S2 and the second space S2. The arrangement of the interconnect lines ML and contact plugs MC and the pitches of the interconnect lines ML may be different in other embodiments.

Each of the interconnect lines in a lower portion of the semiconductor device (e.g., the first to fourth interconnect lines 115b, 125b, 135b, and 145b) may have a smaller width than the interconnect lines (e.g., the fifth to eighth interconnect lines 155b, 165b, 175b, and 185b) in an upper portion of the semiconductor device. Also, spaces between the lower interconnect lines ML may be smaller than spaces between the upper interconnect lines ML. For example, a first distance D1 (e.g., a minimum distance between the first interconnect lines 115b) may be less than a second distance D2 (e.g., a minimum distance between the sixth interconnect lines 165b).

Each of the first, second, sixth, and seventh interconnect lines 115b, 125b, 165b, and 175b may have a relatively higher capacitance ratio to total capacitance of an entirety of the interconnect lines ML than a capacitance ratio of other interconnect lines ML. In addition, the first and second interconnect lines 115b and 125b may include a interconnect pattern with a fine pitch for connecting highly integrated semiconductor elements to include interconnect patterns having a relatively larger range of pitches.

The sixth and seventh interconnect lines 165b and 175b are in a relatively high portion of the semiconductor device and mainly connect spacings between the interconnect layers M. The sixth and seventh interconnect lines 165b and 175b may be formed of interconnect patterns having a single pitch or may include interconnect patterns having relatively few types of pitches. The number of contact plugs MC connected to upper surfaces of the sixth and seventh interconnect lines 165b and 175b may be less than the number of contact plugs MC connected to upper surfaces of the first and second interconnect lines 115b and 125b.

The diffusion barrier layers 112, 122, 132, 142, 152, 162, 172, and 182 may surround lower surfaces and lateral surfaces of the interconnect lines ML and the contact plugs MC in respective interconnect layers M. The diffusion barrier layers 112, 122, 132, 142, 152, 162, 172, and 182 may be formed of a conductive material, and thus may be classified as a portion of the interconnect layer M.

The diffusion barrier layers 112, 122, 132, 142, 152, 162, 172, and 182 may be formed, for example, of at least one of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB).

The respective insulation layers IL may fill spacings between the interconnect lines ML and the contact plugs MC forming the interconnect layer M. The insulation layers IL may include a low dielectric constant (low-k) material or an ultra-low dielectric constant (ultra low-k) material having a dielectric constant lower than a predetermined value, e.g., 2.5. The insulation layers IL may be formed, for example, of hydrogen carbide oxide silicon (SiOCH), porous-hydrogen carbide oxide silicon (porous-SiOCH), or the like.

One or both of the second and third insulation layers 120 and 130 may be a layer formed by a process different from a process for forming the fourth and fifth insulation layers 140 and 150 and the sixth and seventh insulation layers 160 and 170. An embodiment of a process for forming the second and third insulation layers will be described in more detail with reference to FIGS. 6A to 6L.

Lower layers 120a and 130a may be formed in parallel with first and second interconnect lines 115b and 125b in the second and third insulation layers 120 and 130, and may be formed, for example, of a Spin-on-Dielectric (SOD) material such as tonen silazene (TOSZ).

In addition, the lower layers 120a and 130a may be formed of an ultra-low dielectric constant material with no carbon-depletion. Thus, the concentration of carbon inside the second and third insulation layers 120 and 130, which are between adjacent interconnect lines 115b and 125b, may be uniformly distributed. The capacitance of the second and third insulation layers 120 and 130 may be reduced, for example, by about 10% in comparison with an insulation layer including a carbon-deficient region.

At least one of fourth or fifth insulation layers 140 and 150 and an eighth insulation layer 180 may have a carbon-deficient region, in which the concentration of carbon inside the insulation layer IL is relatively low in a region adjacent to the interconnect lines ML, and may have distribution in which the concentration of carbon is increased while being spaced apart from the interconnect lines ML. In another embodiment, the semiconductor device may not include an insulation layer IL having non-uniform distribution of a concentration of carbon.

The sixth and seventh insulation layers 160 and 170 may include lower layers 160a and 170a and upper layers 160b and 170b. The lower layers 160a and 170a and the upper layers 160b and 170b may be formed of the same or different materials.

For example, the upper layers 160b and 170b that are parallel to the sixth and seventh interconnect lines 165b and 175b may have internal air spacings AG1 and AG2, respectively. The air spacing AG1 may be between the adjacent interconnect lines 165b, and the air spacing AG2 may be between the adjacent interconnect lines 175b. The air spacings AG1 and AG2 may be in regions spaced apart from the seventh contact plugs 175a in upper surfaces of the interconnect lines 165b by a third distance D3. The third distance D3 may be different in other embodiments. In some example embodiments, the air spacings AG1 and AG2 may be in contact with the lower layers 160a and 170a.

The upper layers 160b and 170b may be formed to include the air spacings AG1 and AG2, respectively, for example, by being deposited using a material having non-conformal deposition characteristics or by controlling deposition conditions. The upper layers 160b and 170b may be formed, for example, of tetraethoxysilane (TEOS) or hydrogen carbide oxide silicon (SiOCH). The upper layers 160b and 170b may include the air spacings AG1 and AG2 to reduce a parasitic capacitance. In one embodiment, the air spacings AG1 and AG2 may reduce parasitic capacitance by about 17%.

In the example embodiment, the insulation layers 120a and 130a may be formed of a layer with no carbon-depletion. The insulation layers 160b and 170b may be formed of a layer having the air spacings AG1 and AG2, which may be determined based on characteristics of interconnect lines ML inside respective insulation layers IL.

For example, based on the capacitance of an entirety of the interconnect lines ML, an insulation layer IL, disposed at the same height as interconnect lines ML having a relatively large capacitance ratio, may include a layer with no carbon-depletion or a layer having an air spacing. In addition, in an area of the entirety of the interconnect lines ML, an insulation layer IL, disposed at the same height as interconnect lines ML having a relatively low ratio of an area in which contact plugs MC are disposed on upper portions of the interconnect lines ML, may include a layer having an air spacing. The number of an insulation layers IL including a layer with no carbon-depletion and the number of insulation layers IL including a layer having an air spacing may be different for different embodiments.

Thus, according to this example embodiment, the semiconductor device includes a plurality of interconnect layers M and a portion of an insulation layer IL includes a layer with no carbon-depletion or a layer having an air spacing to reduce a dielectric constant. Thus, parasitic capacitance among the interconnect layers M is reduced, which may cause a significant reduction in RC delay and secure or improve one or more electrical properties (e.g., operation speed) of the semiconductor device 100.

The first to eighth dielectric layers 118, 128, 138, 148, 158, 168, 178, and 188 may cover upper surfaces of the interconnect lines ML, respectively. The first to eighth dielectric layers 118, 128, 138, 148, 158, 168, 178, and 188 may protect the interconnects ML, may prevent diffusion, or may be used as etch stop layers during manufacturing. The first to eighth dielectric layers 118, 128, 138, 148, 158, 168, 178, and 188 may be formed, for example, of silicon carbonitride (SiCN), silicon nitride (SiN), silicon oxycarbide (SiOC), or the like.

The first and second dielectric layers 118 and 128 may be on interconnect lines 115b and 125b to cover not only upper surfaces but also lateral surfaces of the interconnect lines 115b and 125b, respectively. The third to eighth dielectric layers 138, 148, 158, 168, 178, and 188 may extend linearly and horizontally to cover upper surfaces of interconnect lines 135b, 145b, 155b, 165b, 175b, and 185b, respectively.

Figure 2:
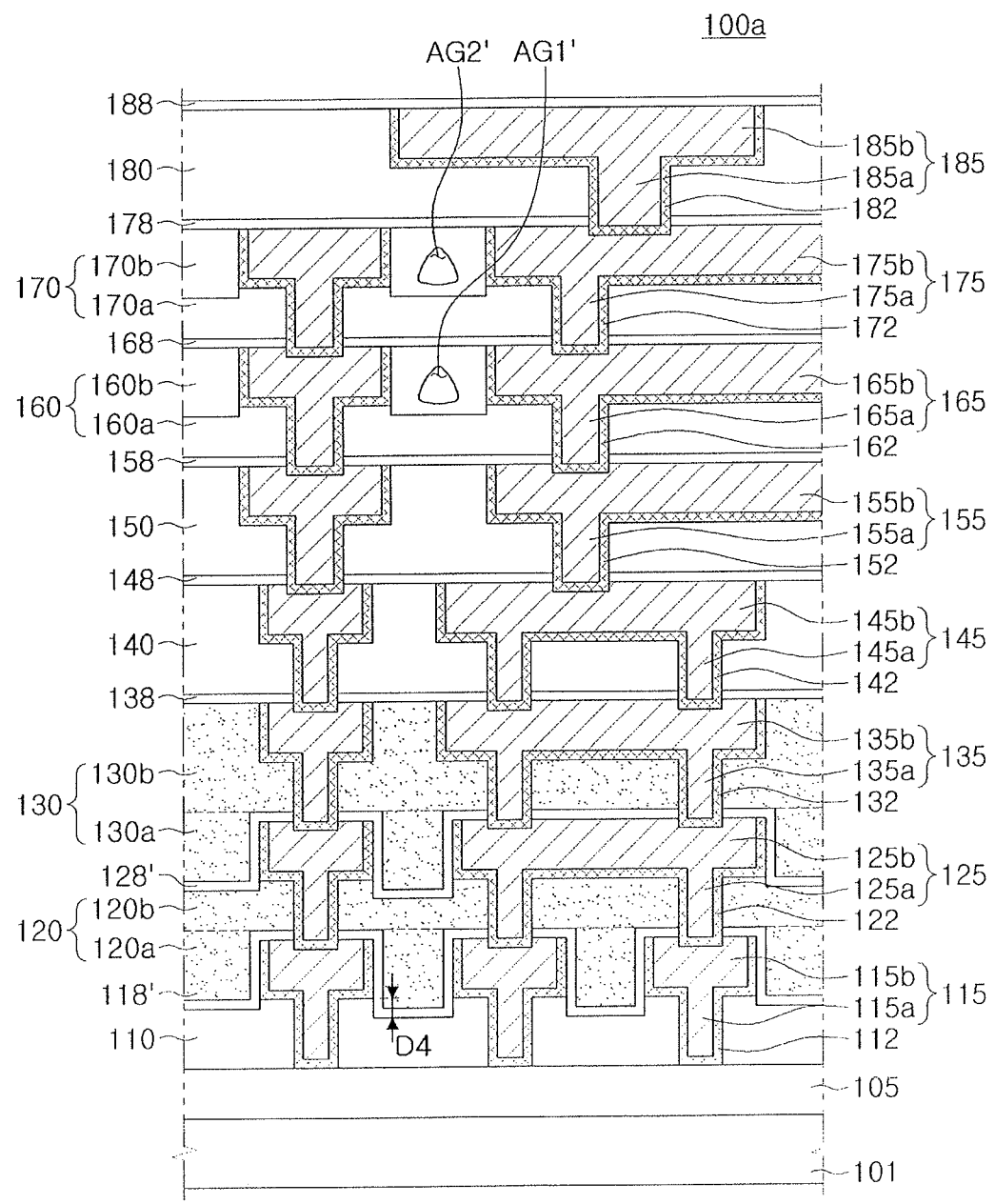
FIGS. 2 to 4 illustrate other embodiments of a semiconductor device.
Figure 3:
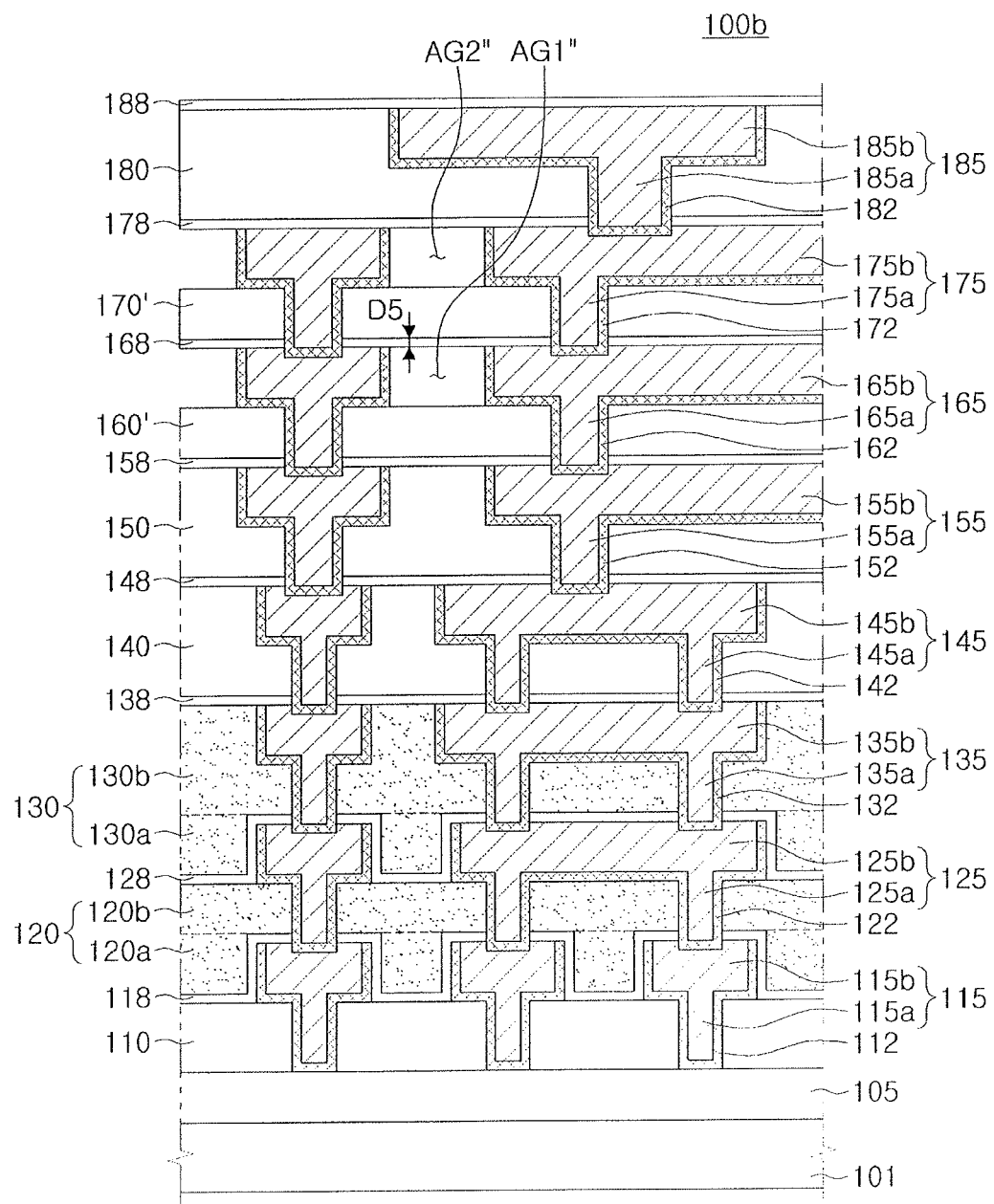
Figure 4:
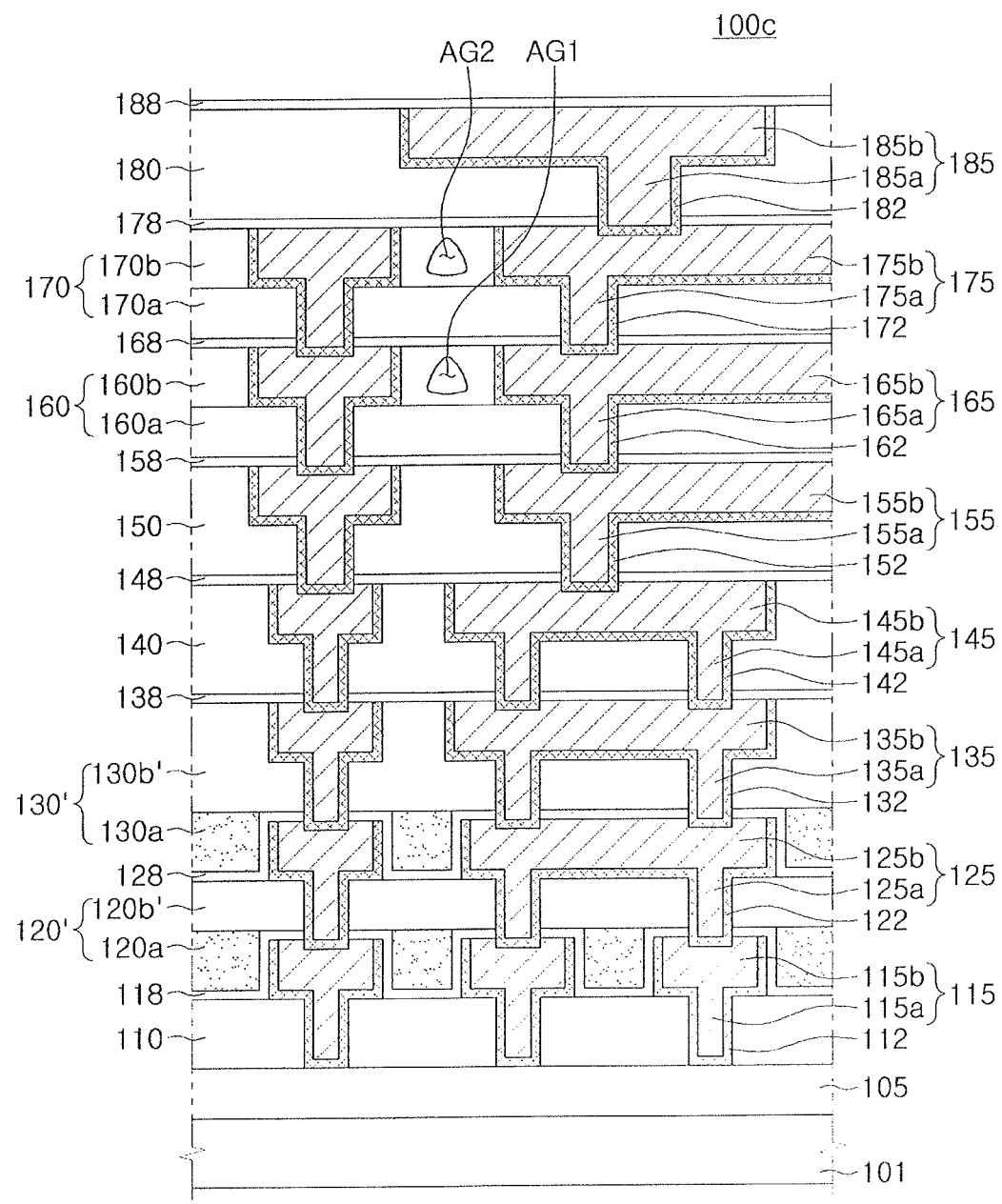

FIGS. 2 to 4 are cross-sectional views illustrating other embodiments of a semiconductor device. FIG. 2 illustrates an embodiment of a semiconductor device 100a which may include a substrate 101, an element layer 105, insulation layers IL, interconnect layers M, diffusion barrier layers 112, 122, 132, 142, 152, 162, 172, and 182, and first to eighth dielectric layers 118', 128', 138, 148, 158, 168, 178, and 188.

Between first interconnect lines 115b and between second interconnect lines 125b, lower surfaces of first and second dielectric layers 118' and 128' are spaced apart from lower surfaces of first and second interconnect lines 115b and 125b, respectively by a fourth distance D4. Thus, in the example embodiment of FIG. 2, the lower surfaces of first and second dielectric layers 118' and 128' are below the interconnect lines. Therefore, the first and second dielectric layers 118' and 128' may be between the first interconnects 115b and between the second interconnect lines 125b, respectively, in recessed form. As a result, boundaries of the insulation layers ML in upper and lower portions of the first and second dielectric layers 118' and 128' may be changed by the first and second dielectric layers 118' and 128'.

In a similar manner, air spacings AG1' and AG2' between the sixth interconnect lines 165b and between the seventh interconnect lines 175b may be below lower surfaces of the sixth and seventh interconnect lines 165b and 175b, respectively. Thus, in sixth and seventh insulation layers 160 and 170, boundaries of lower layers 160a and 170a and upper layers 160b and 170b may be lowered.

FIG. 3 illustrates an embodiment of a semiconductor device 100b which may include a substrate 101, an element layer 105, insulation layers IL, interconnect layers M, diffusion barrier layers 112, 122, 132, 142, 152, 162, 172, and 182, and first to eighth dielectric layers 118, 128, 138, 148, 158, 168, 178, and 188.

Sixth and seventh insulation layers 160' and 170' are not on lateral surfaces of sixth and seventh interconnect lines 165b and 175b, but are only be on lower portions of the sixth and seventh interconnect lines 165b and 175b, respectively. In this embodiment, the lateral surfaces of the sixth and seventh interconnect lines 165b and 175b may include only air spacings AG1" and AG2", respectively. Also, in this example embodiment, the thickness D5 of the sixth and seventh dielectric layers 168 and 178 in upper portions of the air spacings AG1" and AG2" may be greater than the thickness of the sixth and seventh dielectric layers in the example embodiment of FIG. 1B.

FIG. 4 illustrates an embodiment of a semiconductor device 100c which may include a substrate 101, an element layer 105, insulation layers IL, interconnect layers M, diffusion barrier layers 112, 122, 132, 142, 152, 162, 172, and 182, and first to eighth dielectric layers 118, 128, 138, 148, 158, 168, 178, and 188.

Second and third insulation layers 120' and 130' may include lower layers 120a and 130a and upper layers 120b' and 130b' formed of materials different from each other. The lower layers 120a and 130a may be formed of an ultra-low dielectric constant material with no carbon-depletion in a manner similar to the example embodiment in FIG. 1B. The upper layers 120b' and 130b' may be formed of the same material as at least one of fourth, fifth, or eighth insulation layers 140, 150, and 180 and in a process different from that used to form the lower layers 120a and 130a.

The example embodiments described above with reference to FIGS. 1A to 4, may be combined with each other, or portions thereof may be selected and combined with each other.

Figure 5:
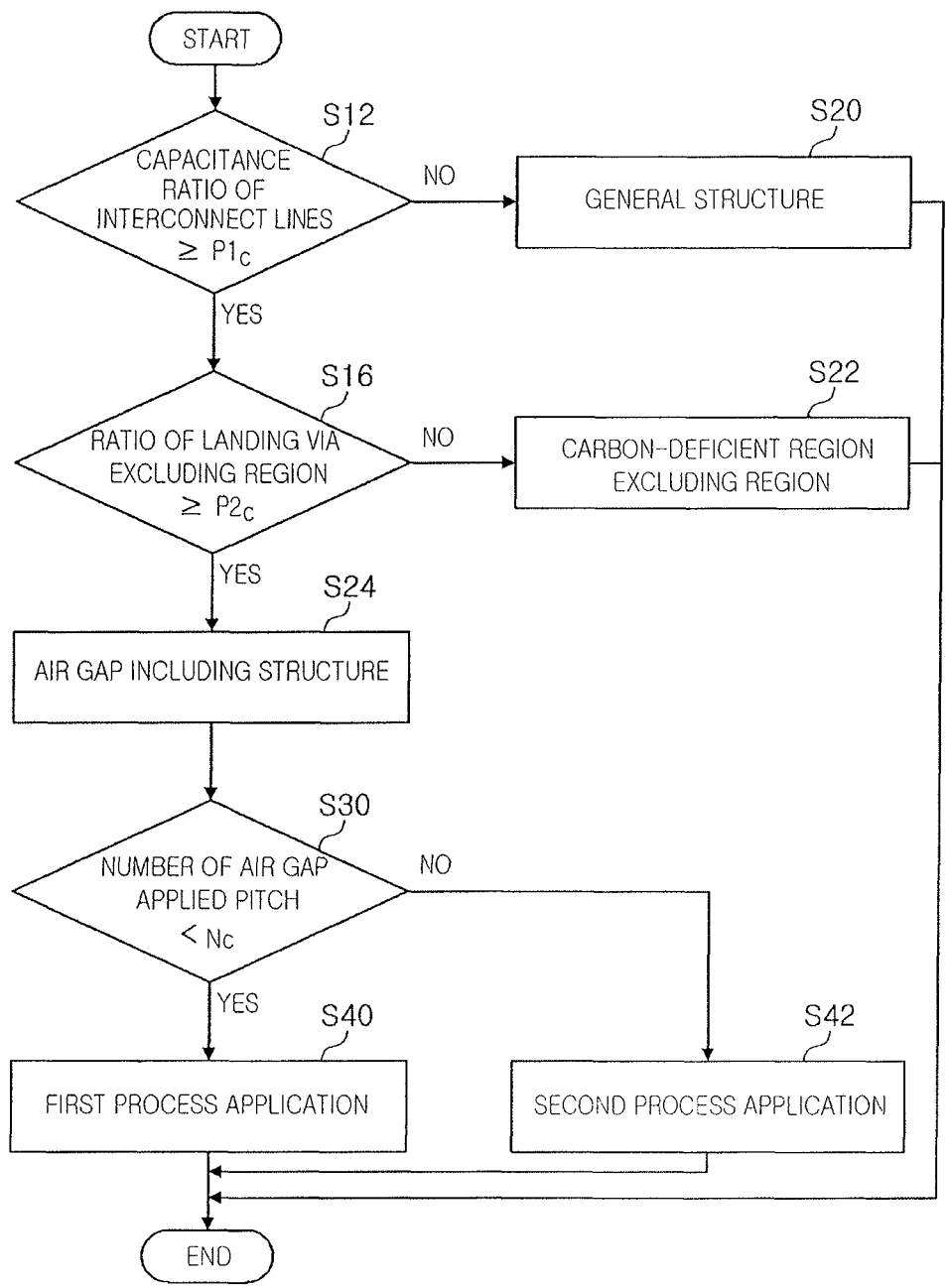
FIG. 5 illustrates an embodiment for determining an insulation layer type.

FIG. 5 illustrates an embodiment of a method for determining the type of insulation layer in a semiconductor device. The method includes an operation for determining the structure of respective insulation layers IL to be manufactured, for example, in the embodiment of FIG. 1B.

The structure of the insulation layers IL may be determined as one of three structures. A general structure S20 refers to a structure formed of a low dielectric constant or ultra-low dielectric constant material such as the fourth, fifth, and eighth insulation layers 140, 150, and 180 in FIG. 1B. According to the general structure S20, the insulation layer IL may include a carbon-deficient region. The carbon-deficient region-excluding structure S22 refers to a structure formed of an ultra-low dielectric constant material not including a carbon-deficient region, such as second and third insulation layers 120 and 130. An air spacing-including structure S24 includes air spacings AG1 and AG2, for example, such as sixth and seventh insulation layers 160 and 170.

The method initially includes determining whether the capacitance ratio of interconnect lines ML inside one insulation layer IL is greater than a critical ratio P1c (S12). The capacitance ratio may refer to a capacitance ratio of interconnect lines ML of a corresponding interconnect layer M to a total capacitance of interconnect lines ML of an entirety of the interconnect layers M. The critical ratio P1c may be, for example, 7% to 10% and may be determined based on the distribution of a capacitance ratio between interconnect layers M, the number of interconnect layers M, and/or another parameter.

When the capacitance ratio is less than the critical ratio P1c (e.g., when the capacitance due to corresponding interconnect lines ML is relatively small), the insulation layers may be manufactured to have the general structure S20.

In some example embodiments, operation S12 may be determined by a ranking of a capacitance ratio of interconnect layers M, instead of critical ratio P1c. For example, a layer having the lowest capacitance ratio or interconnect lines ML in a lower ranking 40% to 70% may be manufactured to have the general structure S20. The subsequent determination may be carried out with respect to insulation layers IL between interconnect lines ML having a relatively high capacitance ratio. For example, interconnect lines ML of a lowermost interconnect layer M may include a interconnect pattern with a fine pitch for connection of highly integrated semiconductor elements inside the element layer 105. Thus, the capacitance ratio may be high.

When the capacitance ratio is equal to or greater than the critical ratio P1c, the method includes determining whether the ratio of a landing via-excluding region is less than a critical ratio P2c (S16). A landing via-excluding region may refer to a region in which interconnect lines ML inside a corresponding insulation layer IL are not connected to contact plugs MC on upper portions of the interconnect lines ML. Thus, with respect to respective interconnect layers M, the ratio of a landing via-excluding region may be calculated based on the ratio of an area of a region in which interconnect lines ML are not connected to contact plugs MC to a total area of the interconnects ML.

In some example embodiments, the landing via-excluding region may be calculated as a region expanded by a predetermined distance from a circumference of contact plugs MC. The critical ratio P2c may be, for example, 90% to 98%. In some example embodiments, the critical ratio P2c may be 96%.

In a manner similar to operation S12 described above, because the ratio of a landing via-excluding region may be determined within a predetermined ratio based on a ranking of a ratio instead of critical ratio P2c in operation S16, the insulation layers may be manufactured to have the air spacing-including structure S24. In some example embodiments, in a manner similar to operation S12 described above, operation S16 may be determined, not based on an area ratio, but based on a capacitance ratio of a region in which interconnect lines ML are not connected to contact plugs MC on upper portions of the interconnect lines ML. On the other hand, the determination in operation S16 may be carried out based on a ratio of a landing via region, e.g., a region in which interconnect lines ML are connected to contact plugs MC on upper portions of interconnect lines ML.

When a ratio of a landing via-excluding region is less than the critical ratio P2c, the insulation layers may be manufactured to have a carbon-deficient region-excluding structure S22. When the contact plugs MC are connected to upper portions of interconnect lines ML, an air spacing may not be provided between the interconnect lines ML around a landing via region, in order to prevent formation of a defect.

When the number of interconnect layers M is high, and when a carbon-deficient region-excluding structure S22 or an air spacing-including structure S24 is applied to an entirety of insulation layers IL, the manufacturing process may be complicated and costs may increase. Thus, through a determination operation in the example embodiment, a corresponding structure is applied to a portion of insulation layers IL to save costs and manufacturing time and to efficiently lower total parasitic capacitance.

Next, when an air spacing-including structure S24 is applied to the insulation layers, a determination is made as to whether the number of pitches of interconnect lines ML to which an air spacing is applied is less than a critical number $N_c$, in order to determine an air spacing forming process S30. However, operation S30 may be selectively carried out and may be omitted in some example embodiments.

Interconnect lines ML forming one interconnect layer M may include interconnect patterns having one or more pitches different from each other. When an air spacing is applied to interconnect lines ML, the number of pitches which have been applied to interconnect patterns may be determined, thereby forming air spacings by different processes. A critical number $N_c$ may be, for example, 2 to 4.

When types of pitches to be applied are less than the critical number $N_c$, a first process may be applied (S40). The first process may be, for example, a process for forming an air spacing AG1 in FIG. 1, by depositing an non-conformal layer as described with reference to FIG. 6M.

When the types of pitches to be applied are greater than the critical number $N_c$, a second process may be applied (S42). The second process may be a process for uniformly forming air spacings between all interconnect patterns, even when the types of pitches vary in comparison with the first process. The second process may be, for example, a process for forming an air spacing AG1" in FIG. 3 using a sacrificial layer 161, as described with reference to FIGS. 7A to 7C.

Figure 6A:
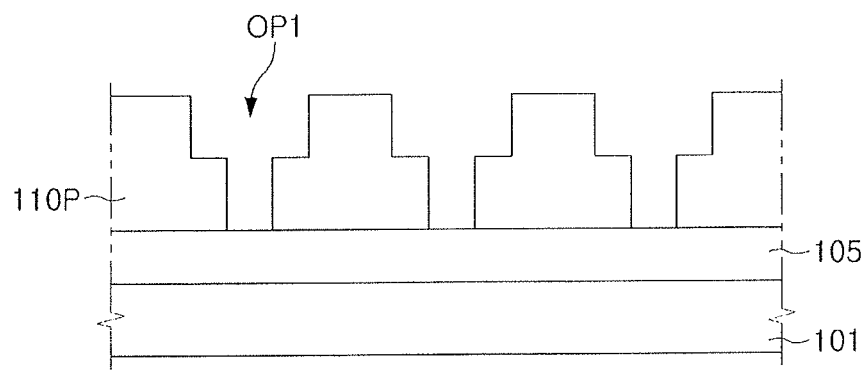
FIGS. 6A to 6M illustrate an embodiment of a method for manufacturing a semiconductor device.

FIGS. 6A to 6M illustrate a process sequence for an embodiment of a method for manufacturing a semiconductor device. Referring to FIG. 6A, an element layer 105 is formed on a substrate 101. This may involve forming one or more semiconductor elements (e.g., transistor(s)) and then an insulation layer on an upper portion of the element layer. The insulation layer is then planarized to form the element layer 105.

Then, a first preliminary insulation layer 110P having first openings OP1 are formed on the element layer 105. The may involve depositing an insulation material on element layer 105 and then etching a portion of the insulation material to form the first preliminary insulation layer 110P. A portion of the first preliminary insulation layer may form a first insulation layer 110 through a subsequent process.

The first preliminary insulation layer 110P may be formed of a low dielectric constant or ultra-low dielectric constant material such as hydrogen carbide oxide silicon (SiOCH) or porous-hydrogen carbide oxide silicon (porous-SiOCH). The first preliminary insulation layer 110P may be formed by a process such as chemical vapor deposition (CVD), low pressure chemical vapor deposition (LPCVD), plasma enhanced chemical vapor deposition (PECVD), high density plasma-chemical vapor deposition (HDP-CVD), a spin coating process, or the like.

Through the subsequent process, lower regions of the first openings OP1 may form areas for contact plugs MC and upper regions of the first openings OP1 may form areas for interconnect lines ML (see, e.g., FIGS. 1A and 1B). Using a additional mask layer, upper regions of the first openings OP1 may be formed to be linear after the lower regions in the form of holes are formed in advance, or the lower regions may be formed as a hole after upper regions having a linear form are formed in advance.

Figure 6B:
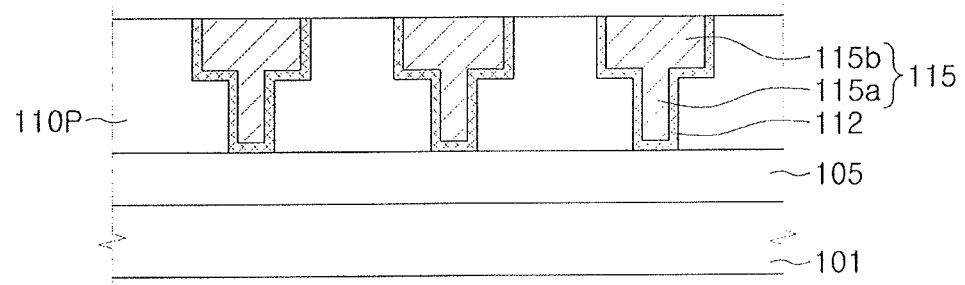

Referring to FIG. 6B, diffusion barrier layers 112 and first interconnect layers 115 may be sequentially formed inside the first openings OP1 of the first preliminary insulation layer 110P. After a material forming the diffusion barrier layers 112 and the first interconnect layers 115 is deposited, a planarization process (e.g., chemical mechanical polishing (CMP)) may be performed to form the diffusion barrier layers 112 and the first interconnect layers 115 inside the first openings OP1.

The diffusion barrier layers 112 may prevent metallic material forming the first interconnect layers 115 from diffusing into the first insulation layers 110 (see, e.g., FIG. 1B). The diffusion barrier layers 112 may be formed, for example, of metal or a metal nitride such as but not limited to titanium (Ti), a titanium nitride (TiN), tantalum (Ta), a tantalum nitride (TaN), ruthenium (Ru), cobalt (Co), manganese (Mn), tungsten nitride layer (WN), nickel (Ni), and nickel boron (NiB). The first interconnect layers 115 may be formed of a metallic material such as copper (Cu), aluminum (Al), titanium (Ti), or tungsten (W).

The diffusion barrier layers 112 and the first interconnect layers 115 may be formed to be conformal along lateral walls of the first preliminary insulation layers 110P and exposed through the first openings OP1. The diffusion barrier layers 112 and the first interconnect layers 115 may be formed, for example, through physical vapor deposition (PVD), a sputtering process, or an atomic layer deposition (ALD) process.

The first preliminary insulation layer 110P around the first openings OP1 may be subject to plasma-induced damage by an etching process when the first openings OP1 are formed and a process of forming the diffusion barrier layers 112. Thus, when the first preliminary insulation layers 110P are a carbon-containing film, a carbon-deficient region may be formed around the first openings OP1. As interconnect lines 115b are formed more densely than contact plugs 115a, the carbon-deficient region may be generated to a greater extent in upper regions of the first preliminary insulation layers 110P, in comparison with the lower regions.

Figure 6C:
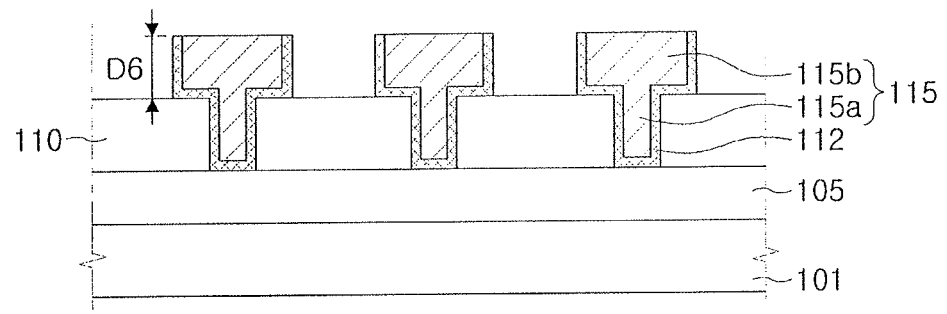

Referring to FIG. 6C, upper portions of the first preliminary insulation layers 110P are partially removed to form the first insulation layers 110. A portion of the first preliminary insulation layer 110P corresponding, for example, to a sixth length D6 may be removed from an upper surface using an etch-back process. In example embodiments, the sixth length D6 may be different in other embodiments. By the process in FIG. 6C, portions of the first preliminary insulation layers 110P between the first interconnect lines 115b having a carbon-deficient region may be removed. Thus, the first insulation layers 110 may be formed without a further photolithographic process.

In a case of the example embodiment in FIG. 2, the first insulation layers may be manufactured by removing portions below lower portions of the first interconnect lines 115b, of the first preliminary insulation layers 110P in the process of FIG. 6C.

In some example embodiments, before a process of removing portions of the first preliminary insulation layers 110P, protective layers including metal, a metal oxide film, or a metal nitride film may be formed on upper surfaces of the first interconnect lines 115b.

Figure 6D:
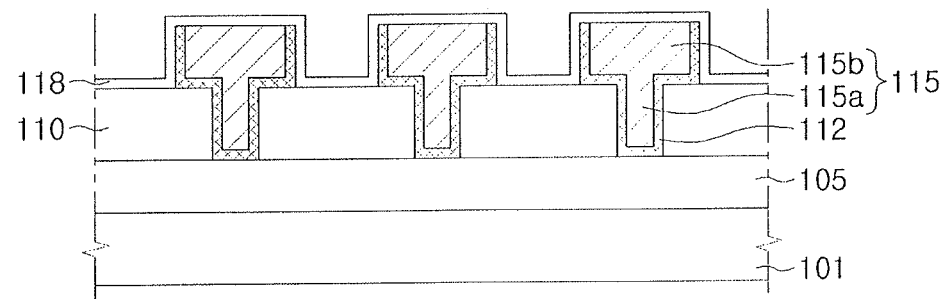

Referring to FIG. 6D, the method further includes forming a first dielectric layer 118 covering upper surfaces of the first insulation layers 110 and upper surfaces and lateral surfaces of the first interconnect lines 115b. The first dielectric layer 118 may be a layer protecting the first interconnect lines 115b from moisture, oxygen, or the like, and may serve to prevent diffusion. The first dielectric layer 118 may be formed, for example, of silicon carbonitride (SiCN), silicon nitride (SiN), silicon oxycarbide (SiOC), or the like. The first dielectric layer 118 may be formed by CVD, ALD, or the like.

Figure 6E:
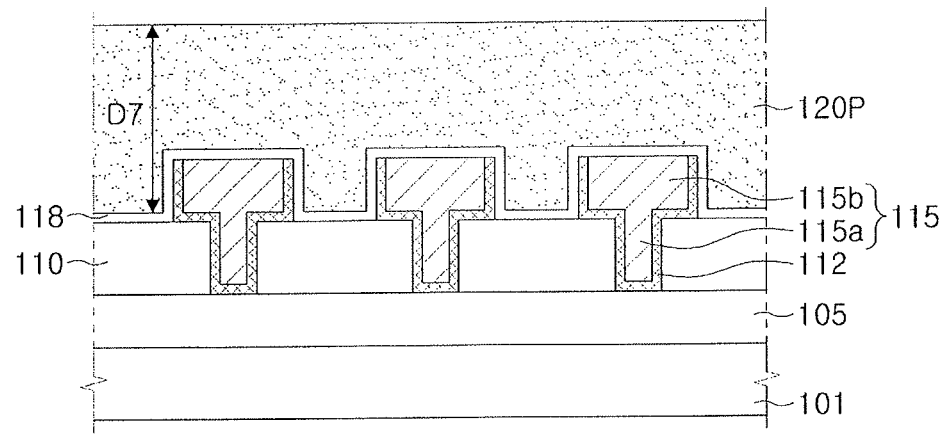

Referring to FIG. 6E, a second preliminary insulation layer 120P may be formed on the first dielectric layer 118. The second preliminary insulation layer 120P may be formed of an ultra-low dielectric constant material and, for example, a silicon carbide-based SOD material. The second preliminary insulation layer 120P may be formed, for example, by a spin-coating process, a flowable chemical vapor deposition (CVD) process, or another process. After the second preliminary insulation layer 120P is deposited, a heat treatment or UV treatment process may be performed.

The second preliminary insulation layer 120P may fill spacings between the first interconnect lines 115b and may be formed upwardly. The second preliminary insulation layer 120P may be formed to a height corresponding, for example, to a seventh length D7 from the first dielectric layer 118. The seventh length D7 may be substantially the same as the height from the first dielectric layer 118 to upper surfaces of second interconnect layers 125 (see, e.g., FIG. 1B) on an upper portion of the second preliminary insulation layer.

In the case of the example embodiment in FIG. 4, a second insulation layer 120 (see, e.g., FIG. 1B) may be manufactured by forming the second preliminary insulation layer at a height to fill spacings between the first interconnect lines 115b in the process of FIG. 6E.

Figure 6F:
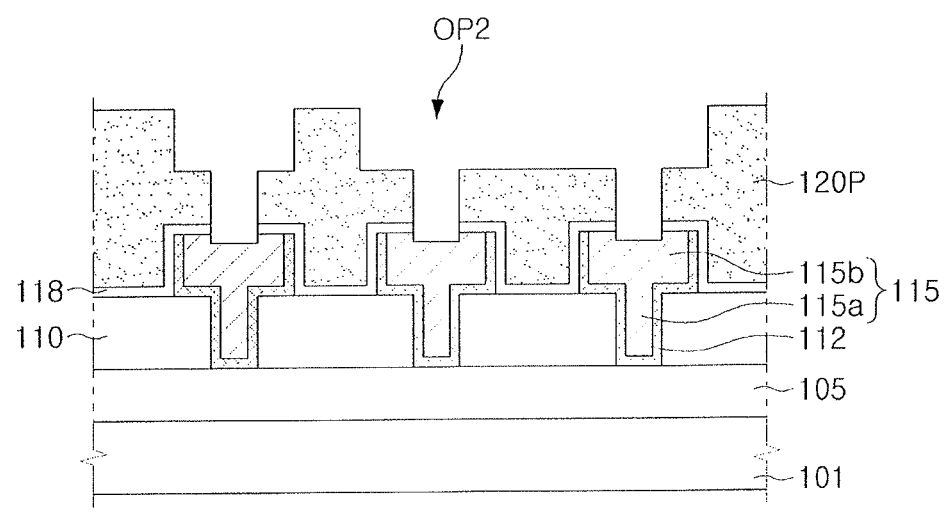

Referring to FIG. 6F, second openings OP2 may be formed inside the second preliminary insulation layer 120P. The second openings OP2 may be formed, for example, by a process similar to the process for forming the first opening OP1 described above. The second openings OP2 may be formed to allow the first interconnect lines 115b in lower portions of the second openings to be recessed to a predetermined depth, or upper surfaces of the first interconnect lines 115b to be exposed.

Figure 6G:
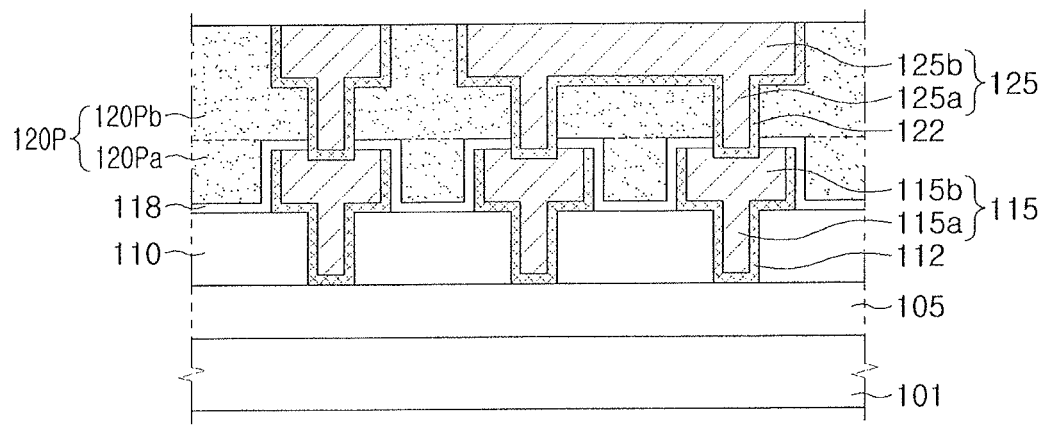

Referring to FIG. 6G, diffusion barrier layers 122 and second interconnect layers 125 may be sequentially formed inside the second openings OP2 of the second preliminary insulation layer 120P. The process illustrated in FIG. 6G may be performed, for example, in a manner similar to the method with reference to FIG. 6B.

After materials forming the diffusion barrier layers 122 and the second interconnect layers 125 are deposited, a planarization process may be performed. The diffusion barrier layers 122 may prevent metallic material forming the second interconnect layers 125 from diffusing to the second insulation layer 120 (see, e.g., FIG. 1B).

The second preliminary insulation layer 120P around the second openings OP2 may be subject to plasma-induced damage by an etching process when the second openings OP2 are formed and a process for forming the diffusion barrier layers 122 is performed in FIG. 6G. Thus, when the insulation layer 120P is a carbon-containing film, a carbon-deficient region may be formed around the second openings OP2. For example, the carbon-deficient region may be generated to a greater extent in upper regions of the second preliminary insulation layer 120P disposed on lateral surfaces of the second interconnect lines 125b, in comparison with lower regions of the second preliminary insulation layer 120P.

FIG. 6G illustrates the second preliminary insulation layer 120P divided into an upper layer 120Pb and a lower layer 120Pa. The upper layer 120Pb is between the second interconnect layers 125 in which etching and depositing processes are performed. The lower layer 120Pa between the first interconnect lines 115b is not damaged by such processes.

Figure 6H:
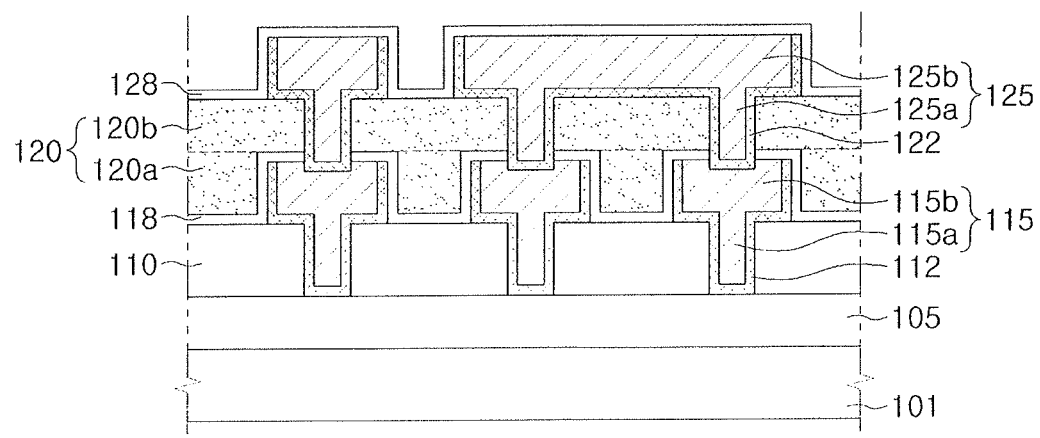

Referring to FIG. 6H, upper portions of the second preliminary insulation layer 120P are partially removed to form a second insulation layer 120 and to form a second dielectric layer 128 above the second insulation layer. The process illustrated in FIG. 6H may be performed, for example, in a manner similar to the method in FIGS. 6C and 6D.

Upper portions of the second preliminary insulation layer 120P, for example, may be partially removed using an etch-back process. Thus, portions of the second preliminary insulation layer 120P between the second interconnect lines 125b having a carbon-deficient region may be partially removed. A lower layer 120a of the second insulation layer 120 between the first interconnect lines 115b may be a layer not damaged by etching and depositing. In the cause of the example embodiment of FIG. 2, the second insulation layer may be manufactured by removing the second preliminary insulation layer 120P to lower portions of the second interconnect lines 125b in the process of FIG. 6H.

The second dielectric layer 128 may protect the second interconnect lines 125b from an external environment and may serve to prevent diffusion.

Figure 6I:
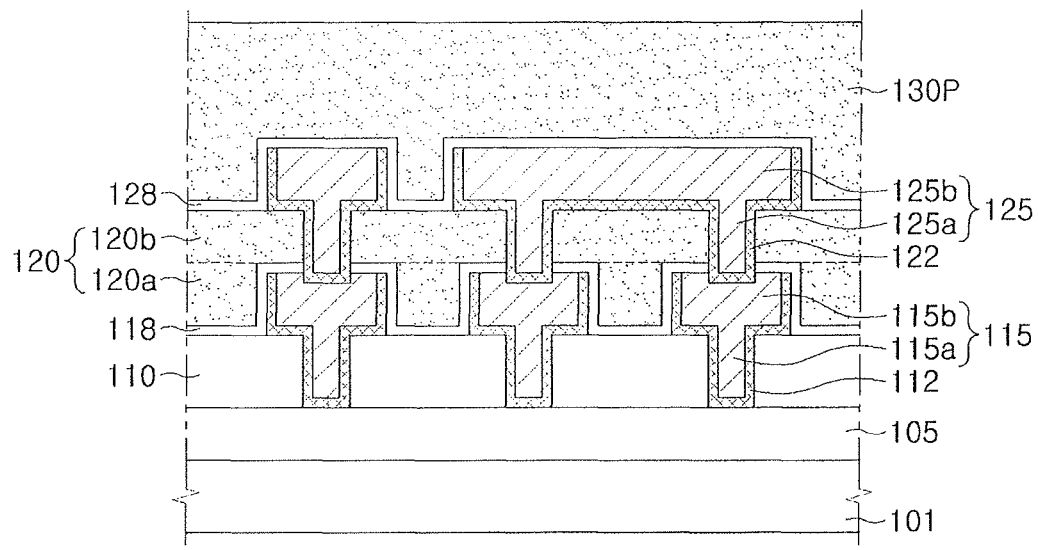

Referring to FIG. 6I, a third preliminary insulation layer 130P may be formed on the second dielectric layer 128. The process in FIG. 6I may be performed, for example, in a manner similar to the method of FIGS. 6C and 6D.

The third preliminary insulation layer 130P may fill spacings between the second interconnect lines 125b and may be formed upwardly. An upper surface level of the third preliminary insulation layer 130P may be substantially the same as upper surface levels of third interconnect layers 135 (see, e.g., FIG. 1B). In the case of the example embodiment in FIG. 4, a third insulation layer 130 (see, e.g., FIG. 1B) may be manufactured by forming the third preliminary insulation layer to a height sufficient to fill spacings of the second interconnect lines 125b in the process of FIG. 6I.

Figure 6J:
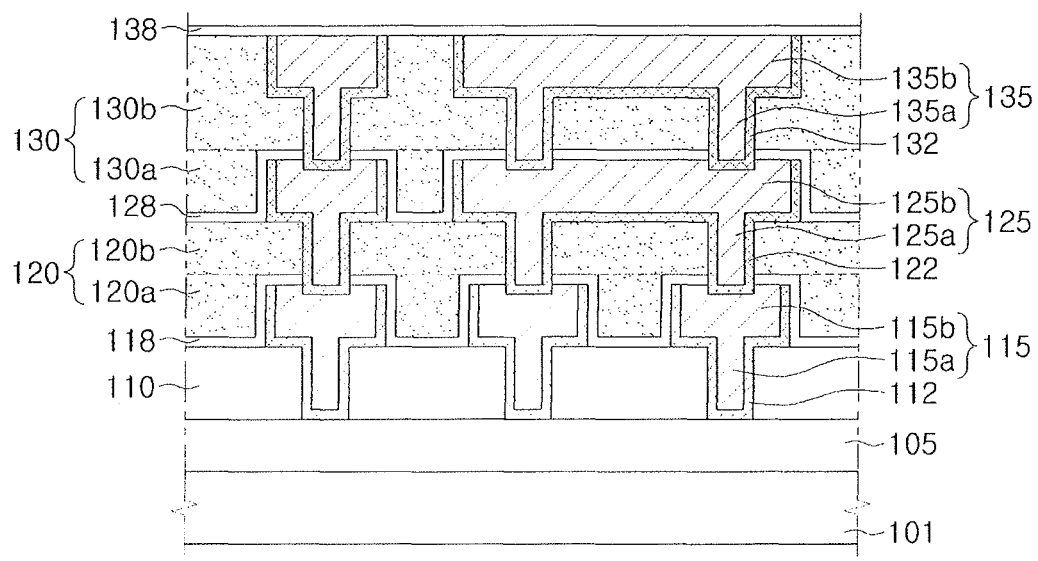

Referring to FIG. 6J, after the third interconnect layer 135 is formed inside the third preliminary insulation layer 130P, a third dielectric layer 138 may be formed thereon. The processes described in FIGS. 6F and 6G may be repeatedly performed to form the third insulation layer 130 and the third interconnect layer 135.

The third dielectric layer 138 may be formed to extend horizontally to cover upper surfaces of the third insulation layer 130 and the third interconnect layers 135. The third dielectric layer 138 may be formed of a material which is the same as or different from a material of the first and second dielectric layers 118 and 128. The third dielectric layer 138 may perform a diffusion prevention function and an etch stop function.

Figure 6K:
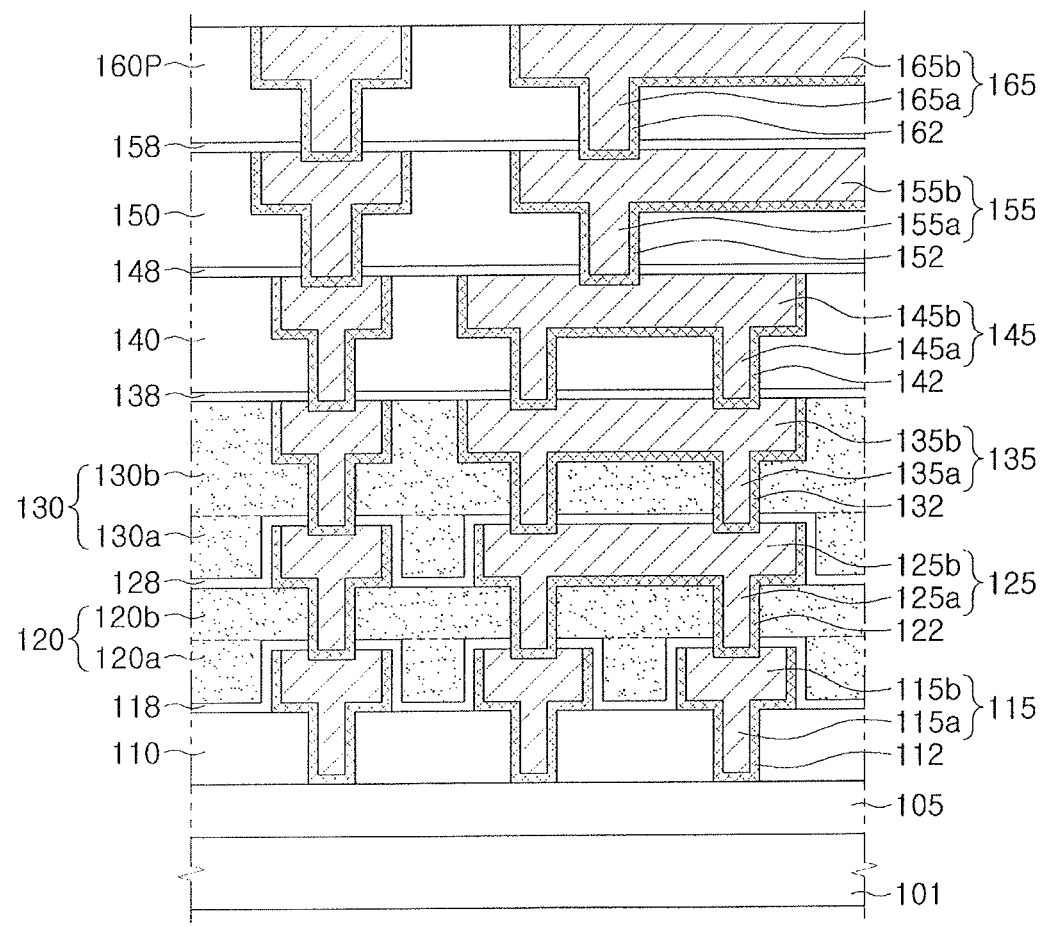

Referring to FIG. 6K, fourth and fifth insulation layers 140 and 150, a sixth preliminary insulation layer 160P, and fourth to sixth interconnect layers 145, 155, and 165 may be formed on the third dielectric layer 138.

After the respective fourth and fifth insulation layers 140 and 150 including openings and the sixth preliminary insulation layer 160P are formed, the openings are filled with conductive material to form the fourth to sixth interconnect layers 145, 155, and 165. Diffusion barrier layers 142, 152, and 162 may be formed on lower surfaces and lateral surfaces of the fourth to sixth interconnect layers 145, 155, and 165. Fourth and fifth dielectric layers 148 and 158 may be formed on upper surfaces of the fourth and fifth interconnect layers 145 and 155.

At least a partial region of the fourth and fifth insulation layers 140 and 150 and the sixth preliminary insulation layer 160P may be damaged during an process of forming the fourth to sixth interconnect layers 145, 155, and 165. Thus, carbon-deficiency may occur in a region adjacent to the fourth to sixth interconnect layers 145, 155, and 165. In some example embodiments, the fourth and fifth insulation layers 140 and 150, and the sixth preliminary insulation layer 160P may be formed of a material different from a material of the second and third insulation layers 120 and 130, and thus may not include a carbon-deficient region.

Figure 6L:
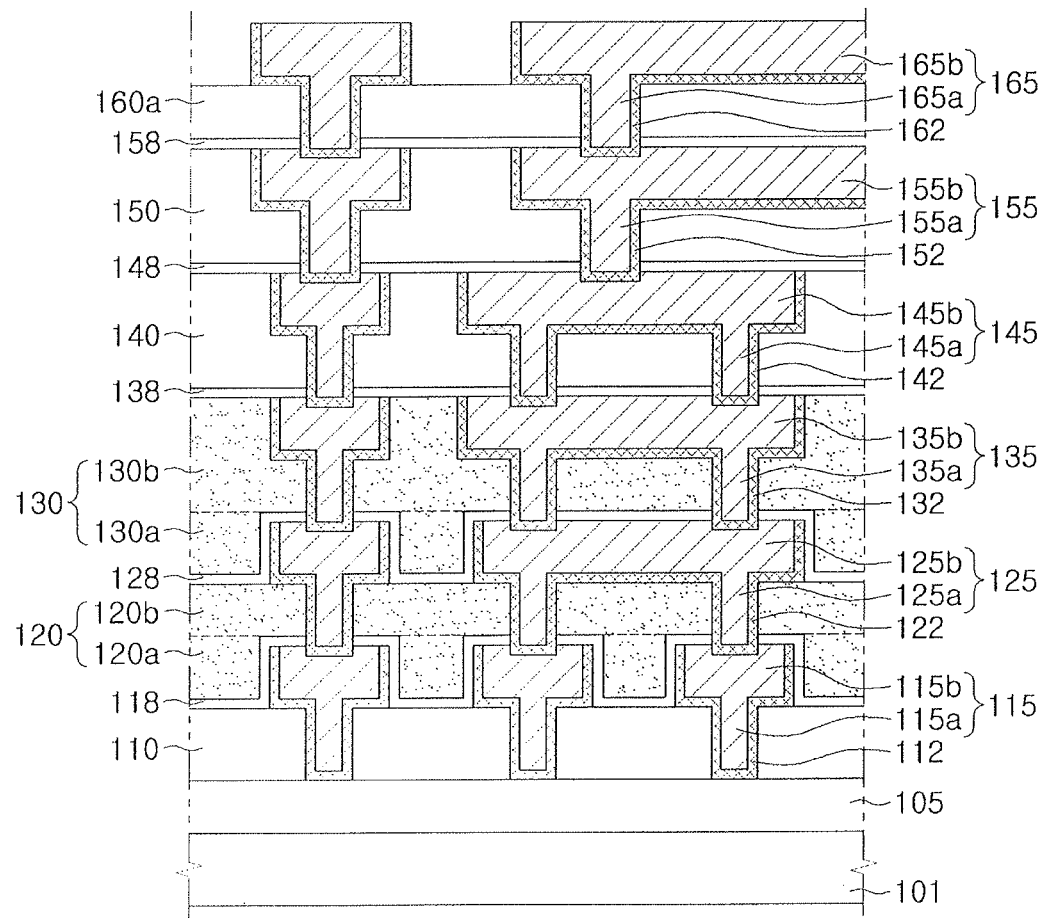

Referring to FIG. 6L, upper portions of the sixth preliminary insulation layer 160P are partially removed to form a lower layer 160a of a sixth insulation layer 160.

Before the sixth preliminary insulation layer 160P is removed, a mask layer may be formed by a photolithographic process. The mask layer may be patterned so as not to allow a region corresponding to a via landing region to be exposed, e.g., a region in which seventh contact plugs 175a (see, e.g., FIG. 1B) are disposed on upper portions of the mask layer. Upper portions of the sixth preliminary insulation layer 160P may be partially removed using an etching process. By the process in FIG. 6L, the sixth preliminary insulation layer 160P between the sixth interconnect lines 165b including a carbon-deficient region may be removed.

In a case of the example embodiment in FIG. 2, the sixth insulation layer may be manufactured by removing the sixth preliminary insulation layer 160P to lower portions of the sixth interconnect lines 165b in the process in FIG. 6L.

In some example embodiments, before a process of removing the sixth preliminary insulation layer 160P is performed, a protective layer of metal, a metal oxide film, or a metal nitride film may be formed on upper surfaces of the sixth interconnect lines 165b.

Figure 6M:
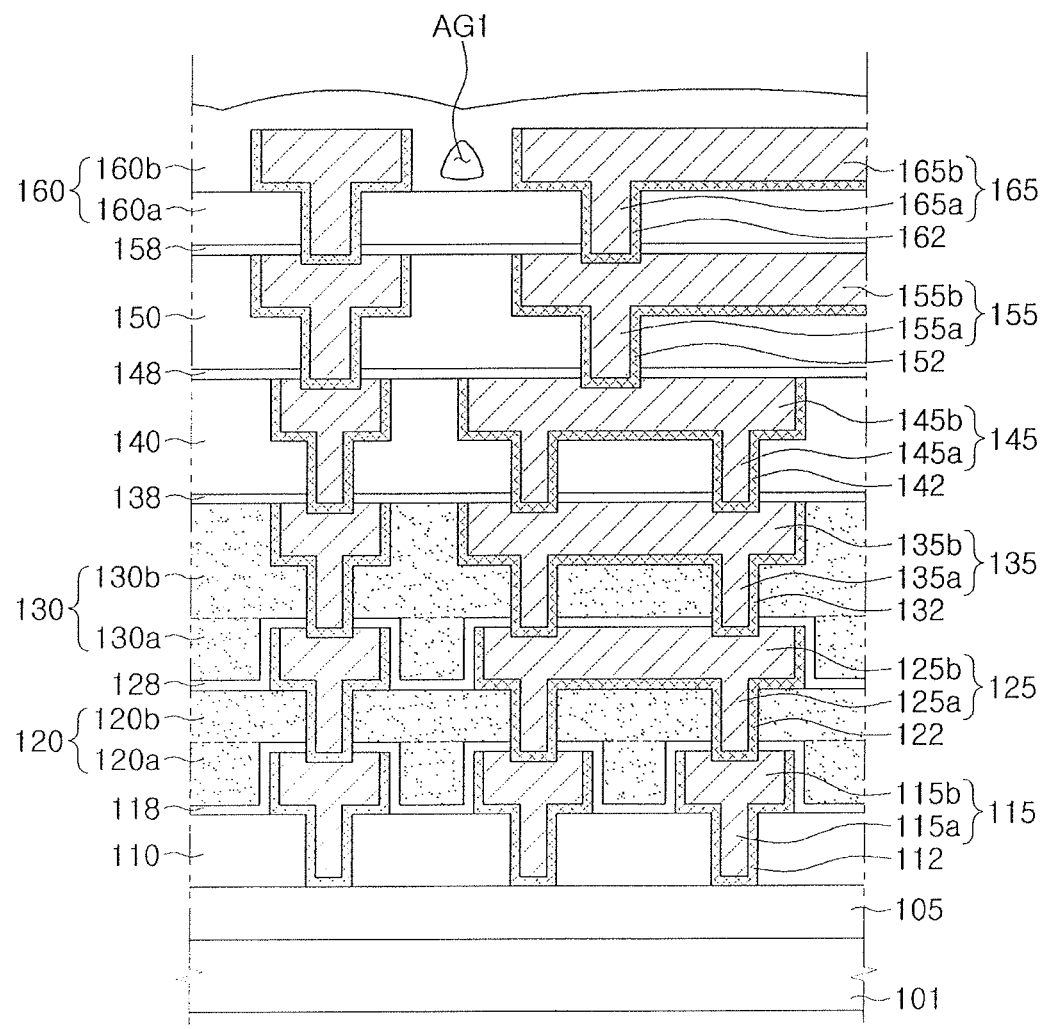

Referring to FIG. 6M, an upper layer 160b of the sixth insulation layer 160 may be provided between the sixth interconnect lines 165b. The upper layer 160b may be deposited not to be conformal and to have an air spacing AG1 therein. The air spacing AG1 may be in the form of an air tunnel extending in one direction along the sixth interconnect lines 165b.

The upper layer 160b may be formed using a sputtering or PVD process in which step coverage characteristics are not good. Thus, the upper layer may be relatively thickly formed in upper surfaces of the sixth interconnect lines 165b and may be relatively thinly formed in lateral surfaces of the sixth interconnect lines 165b and upper surfaces of the lower layer 160a.

The upper layer 160b may have the air spacing AG1, and thus may be formed as a low dielectric constant layer. This may reduce parasitic capacitance between the sixth interconnect lines 165b.

Next, a planarization process is performed to allow upper surfaces of the sixth interconnect lines 165b to be exposed, thereby removing portions of the upper layer 160b.

With reference also to FIG. 1B, the processes described above may be repeatedly performed to form a seventh insulation layer 170 having an air spacing AG2 and seventh interconnect layers 175. Finally, an eighth insulation layer 180 and eighth interconnect layers 185 may be formed in a manner similar to the method of forming the fourth and fifth insulation layers 140 and 150 and fourth and fifth interconnect layers 145 and 155 in order to manufacture the semiconductor device 100 in FIG. 1B.

Figure 7A:
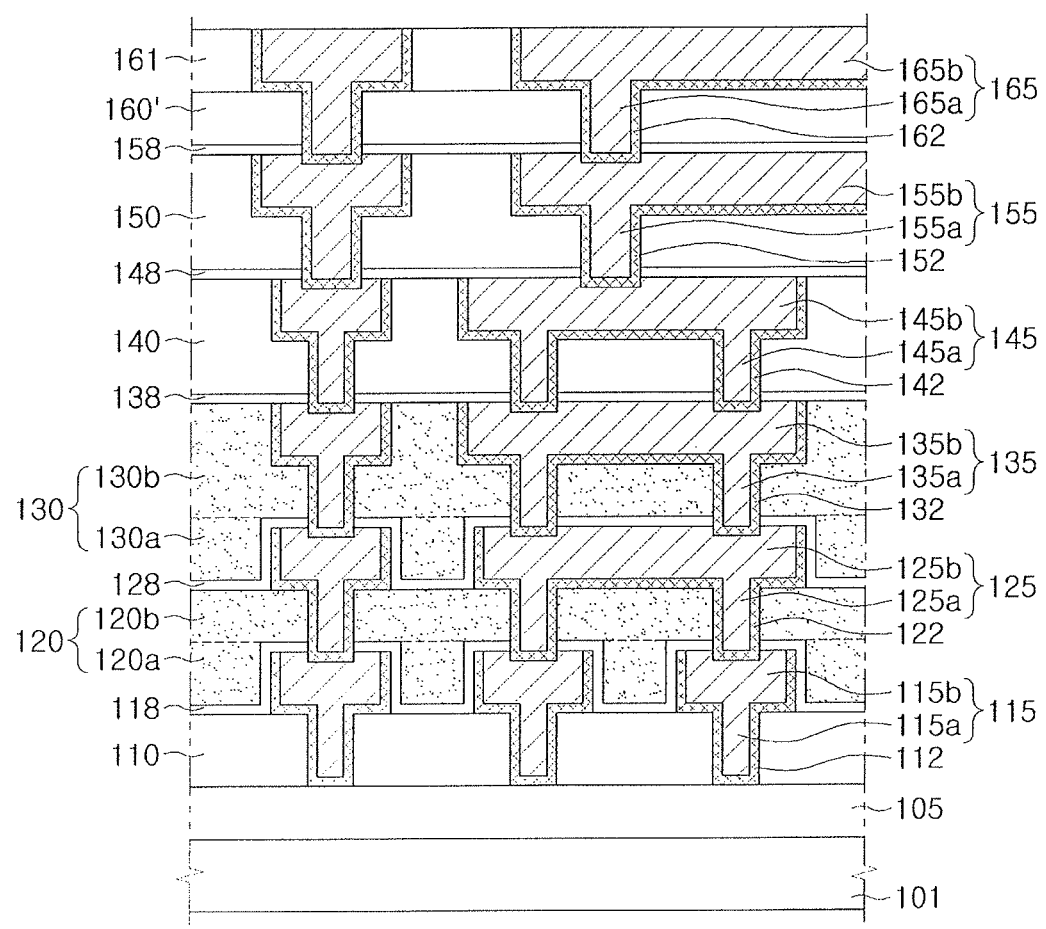
FIGS. 7A to 7C illustrate views another embodiment of a method for manufacturing a semiconductor device.
Figure 7B:
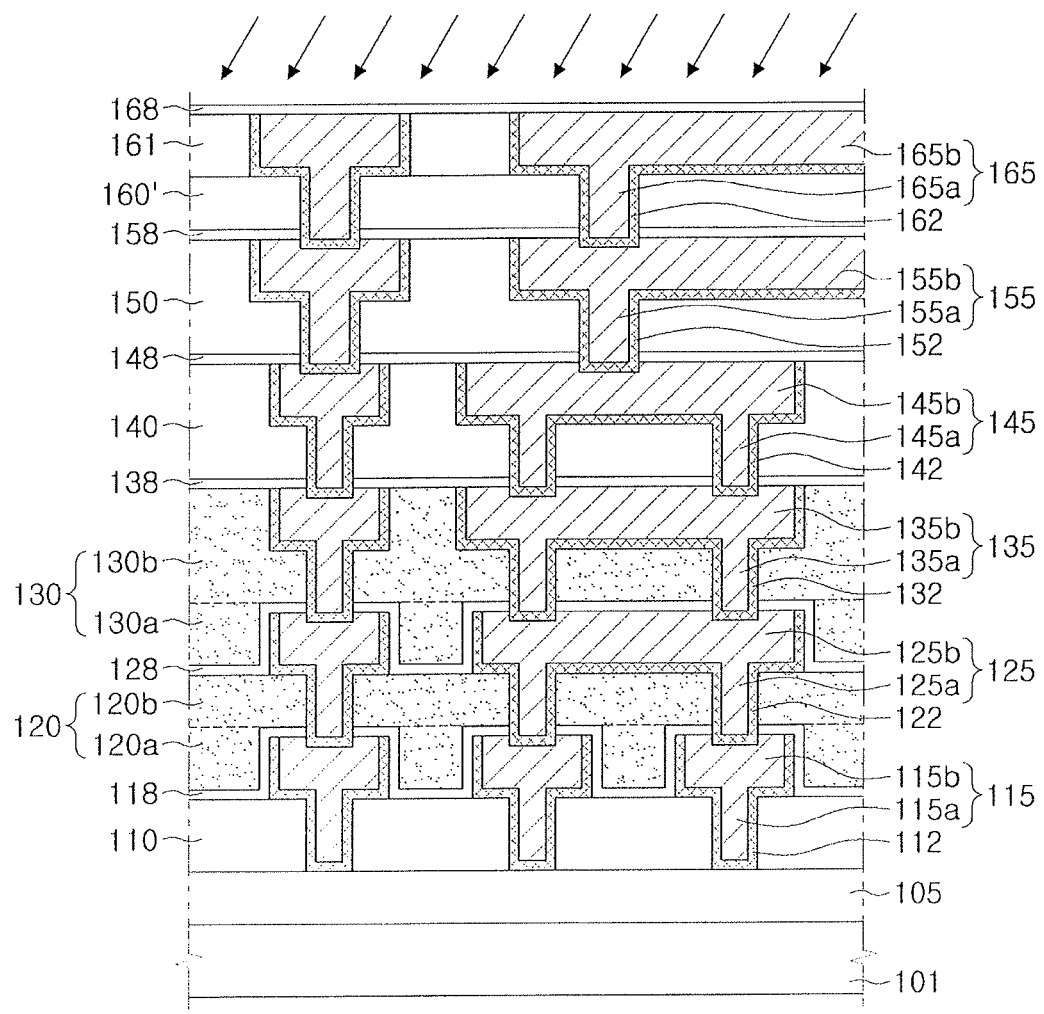
Figure 7C:
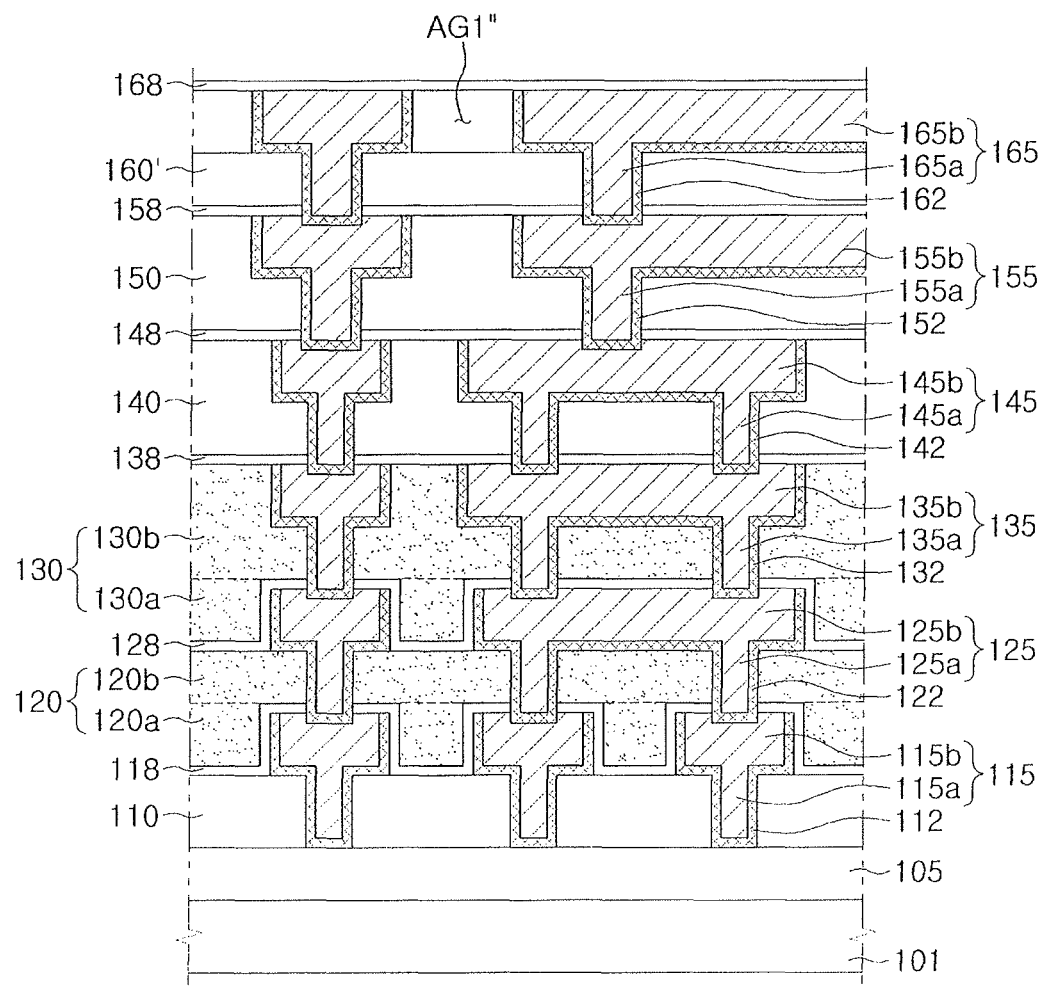

FIGS. 7A to 7C illustrate a process sequence of another embodiment of a method for manufacturing a semiconductor device. In an example embodiment, a method of manufacturing a semiconductor device 100b in FIG. 3 will be described, and descriptions in common with FIGS. 6A to 6M will be omitted.

With reference to FIG. 7A, the method initially includes forming first to fifth interconnect layers 115, 125, 135, 145, and 155. Then, a sixth insulation layer 160' and a sacrificial layer 161 may be sequentially formed thereon. The first to fifth interconnect layers 115, 125, 135, 145, and 155 may be formed, for example, in the same manner as described above with reference to FIGS. 6A to 6K.

Next, a sixth insulation layer 160' and a sacrificial layer 161 may be formed above a fifth dielectric layer 158. The sacrificial layer 161 may be formed of material having a chemical structure which may be easily modified by a plasma treatment or a UV treatment. For example, the sacrificial layer 161 may be formed of a silicon oxide-based material containing a hydrocarbon group such as an alkyl group. In one embodiment, the sacrificial layer 161 may be formed, for example, of a UV decomposition material such as polyketoester, polyketoamide, or the like. The sacrificial layer 161 may be formed using a process of CVD, PVD, spin coating, or the like.

Referring to FIG. 7B, after a sixth dielectric layer 168 is formed on the sacrificial layer 161, a process for treating the sacrificial layer 161 may be performed. The sixth dielectric layer 168 may be formed of a stable material for a plasma or UV treatment in the process in FIG. 7B, and may be more thickly formed than the first to fifth dielectric layers 118, 128, 138, 148, and 158 as described with reference to FIG. 3. In some example embodiments, a capping layer may be formed instead of the sixth dielectric layer 168.

The sacrificial layer 161 may be modified through plasma treatment or UV irradiation. For example, when using a plasma treatment, a gas is injected into a chamber, and thus, plasma is formed to thereby modify the sacrificial layer 161 by plasma-induced damage. For example, when using a UV treatment, the sacrificial layer 161 may be decomposed by irradiated UV light.

Referring to FIG. 7C, a portion of the modified sacrificial layer 161 is selectively removed to form an air spacing AG1". The portion of the modified sacrificial layer 161 may be decomposed in the treating process, and thus removed or selectively removed using a separate wet etching process, or the like. Thus, a region between the sixth interconnect lines 165b may have the air spacing AG1".

Next, referring to FIG. 3, a seventh insulation layer 170' having an air spacing AG2" and seventh interconnect layers 175 may be formed by repeatedly performing the process described above.

Figure 8:
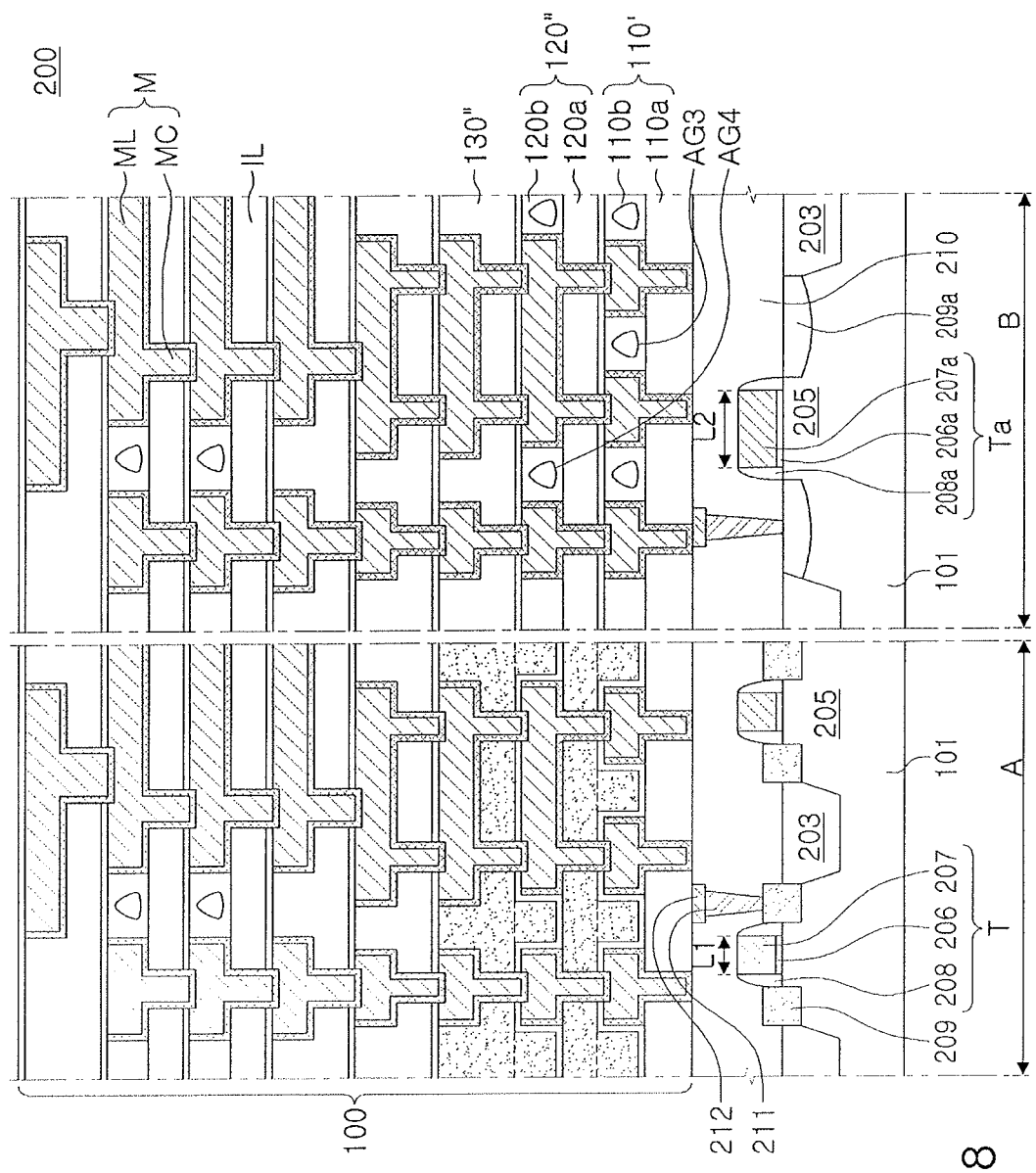
FIG. 8 illustrates another embodiment of a semiconductor device.

FIG. 8 is a cross-sectional view illustrating another embodiment of a semiconductor device 200. Referring to FIG. 8, the semiconductor device 200 may include first and second regions A and B. The first region A may include transistors having a first length L1 and the second region B may be a region including transistors having a second length L2 greater than the first length L1. The first and second lengths may be channel lengths of the transistors. In one embodiment, the first region A may be a processor region of the semiconductor device 200 and the second region B may be a memory region or an input and output circuit region.

The semiconductor device 200 may include an active region 205 inside the substrate 101, an element isolation region 203, first and second elements T and Ta on the substrate 101, and lower interconnect layers 211 and 212.

Each of the first and second elements T and Ta may respectively include gate insulation layers 206 and 206a, gate electrodes 207 and 207a, and spacers 208 and 208a. Source/drain regions 209 and 209a may be on sides of respective ones of the first and second elements T and Ta. The source/drain regions 209 of the first elements T may have an elevated source/drain form. The first elements T may be, for example, a FinFET element. The source/drain regions 209a of the second elements Ta may be inside the substrate 101.

An element insulation layer 210 may be on the first and second elements T and Ta. Each of the lower interconnect layers 211 and 212 may pass through the element insulation layer 210 and may be connected to the gate insulation layers 206 and 206a or the source/drain regions 209 and 209a, respectively.

A plurality of interconnect layers M may be above the lower interconnect layers 211 and 212. The interconnect layers M and insulation layers IL may have the same structures, for example, as in FIG. 1B and may be in the first region A. The interconnect layers M and insulation layers IL may have the structures described with reference to FIGS. 2 to 4 disposed therein.

The interconnect layers M and insulation layers IL in second region B may have structures different from the interconnect layers M and insulation layers IL in the first region A. For example, the second region B may include first to third insulation layers 110', 120", and 130" different from insulation layers in the first region A. In the second region B, the insulation layers IL may not have a carbon-deficient region-excluding structure S22 (see, e.g., FIG. 5). However, the first and second insulation layers 110' and 120" in lower portions of the semiconductor device may have air spacings AG3 and AG4. The third insulation layer 130" may be formed to have the general structure S20 (see, e.g., FIG. 5).

As in the example embodiment, when the semiconductor device 200 is formed of regions including elements T and Ta having sizes different from each other, structures of insulation layers IL between interconnect layers M may be formed to be different from each other in each region. When sizes of the elements T and Ta are relatively large and a relatively large number of interconnect lines ML having a single pitch are provided, an air spacing-including structure S24 (see, e.g., FIG. 5) may be applied to insulation layers IL in a lower portion of the semiconductor device. Arrangements of the insulation layers IL in regions different from each other may be variously changed in example embodiments.

Figure 9:
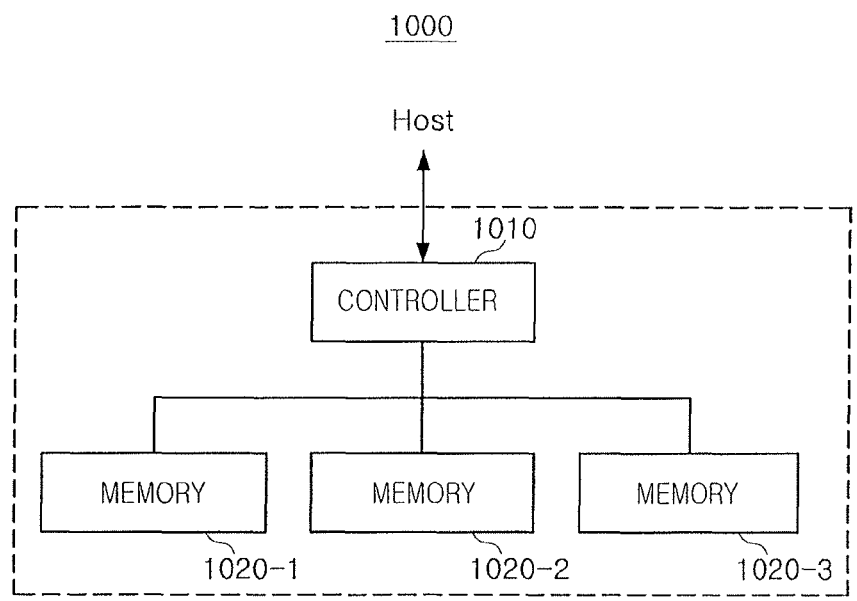
FIG. 9 illustrates an embodiment of a storage device.

FIG. 9 illustrates an embodiment of a storage device 1000 which includes a semiconductor device according to any of the aforementioned embodiments. With reference to FIG. 9, the storage device 1000 includes a controller 1010 for communicating with a host and memories 1020-1, 1020-2, and 1020-3 for storing data. Each of the controller 1010 and the memories 1020-1, 1020-2, or 1020-3 may include the semiconductor device according to one or more of the aforementioned embodiments.

The host communicating with the controller 1010 may be, for example, a smartphone, a digital camera, a desktop computer, a laptop computer, a portable media player, or another device. The controller 1010 may store data on the memories 1020-1, 1020-2, and 1020-3 or generate a command CMD for retrieving data from the memories 1020-1, 1020-2, and 1020-3 by receiving a data writing or reading request transmitted from the host.

As illustrated in FIG. 9, one or more memories 1020-1, 1020-2, and 1020-3 may be connected to the controller 1010 in parallel to each other inside the storage device 1000. Because a plurality of memories 1020-1, 1020-2, and 1020-3 are connected to the controller 1010 in parallel, the storage device 1000 may be implemented as a large capacity, e.g., a solid state drive (SSD).

Figure 10:
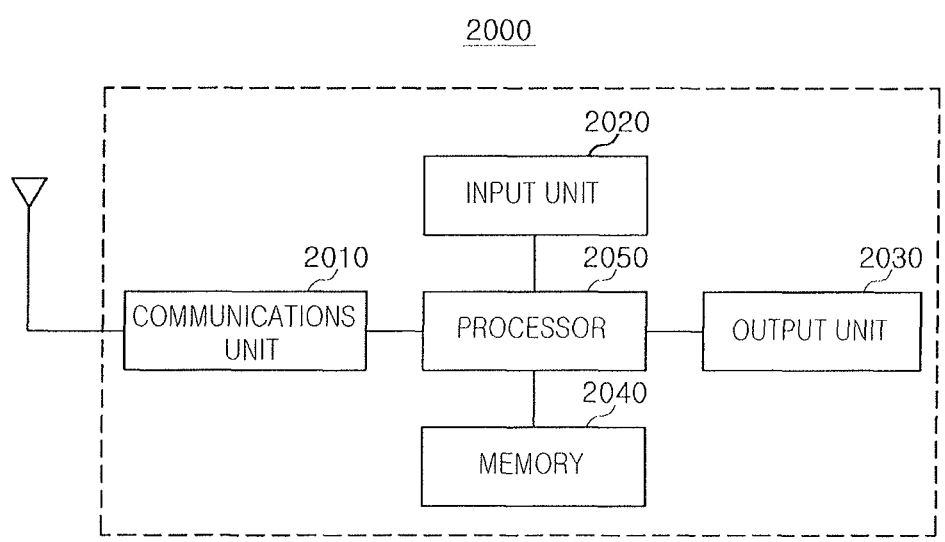
FIG. 10 illustrates an embodiment of an electronic device.

FIG. 10 illustrates an embodiment of an electronic device 2000 which includes a semiconductor device according to any of the aforementioned embodiments. Referring to FIG. 10, the electronic device 2000 includes a communications unit 2010, an input unit 2020, an output unit 2030, a memory 2040, and a processor 2050.

The communications unit 2010 may include a wired/wireless communications module, a wireless Internet module, a local area communications module, a GPS module, a mobile communications module, and/or the like. The wired/wireless communications module in the communications unit 2010 may be connected to an external communications network to transmit and receive data using various communications standards.

The input unit 2020 allows a user to control operations of the electronic device 2000. For example, the input unit 2020 may include a mechanical switch, a touch screen, a voice recognition module, and the like. In addition, the input unit 2020 may include a mouse operated in a manner of a track ball, a laser pointer or the like, or a finger mouse device. In one embodiment, the input unit 2020 may include various sensor modules to allow a user to input data therewith.

The output unit 2030 may output information processed by the electronic device 2000 in the form of audio or video. The memory 2040 may store a program for processing and controlling the processor 2050, data, or the like therein. The processor 2050 may transmit a command to the memory 2040 according to required operations to thus store or retrieve data.

The memory 2040 may be embedded in the electronic device 2000 or may communicate with the processor 2050 through a separate interface. When the memory communicates with the processor 2050 through the separate interface, the processor 2050 may store or retrieve data in or from the memory 2040 through various interface standards such as SD, SDHC, SDXC, MICRO SD, USB, and the like.

The processor 2050 may control operations of respective portions in the electronic device 2000. The processor 2050 may perform controlling and processing related to voice calls, video calls, data communications, and the like, or may perform controlling and processing to multimedia playback and management. In addition, the processor 2050 may process input transmitted through the input unit 2020 by a user, and may output a result thereof through the output unit 2030. In addition, as described above, the processor 2050 may store data required for controlling operations of the electronic device 2000 in the memory 2040, or may retrieve data required therefor from the memory 2040. At least one of the processor 2050 and the memory 2040 may include the semiconductor device according to various example embodiments of the present inventive concept described above with reference to FIGS. 1 to 4, and FIG. 8.

Figure 11:
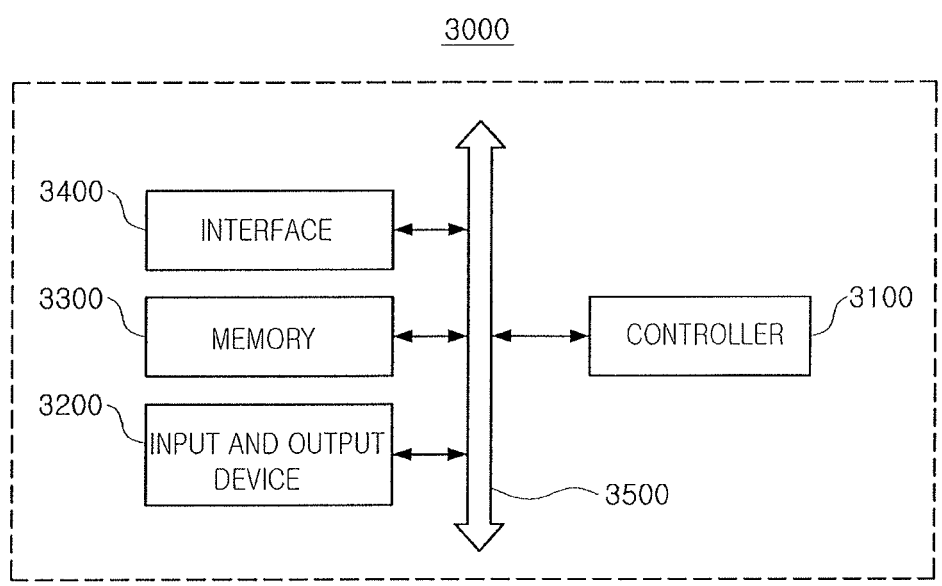
FIG. 11 illustrates an embodiment of a system.

FIG. 11 illustrates an embodiment of a system 3000 which includes a semiconductor device according to one or more of the aforementioned example embodiments. Referring to FIG. 11, the system 3000 may include a controller 3100, an input/output device 3200, a memory 3300, and an interface 3400. The system 3000 may be a mobile system or a system transmitting or receiving information. The mobile system may be a PDA, a portable computer, a web tablet, a wireless phone, a mobile phone, a digital music player or a memory card.

The controller 3100 may serve to execute a program and control the system 3000. The controller 3100 may be, for example, a microprocessor, a digital signal processor, a microcontroller, or a device similar thereto.

The input/output device 3200 may be used to input or output data of the system 3000. The system 3000 may be connected to an external device, for example, a personal computer or a network using the input/output device 3200, to exchange data with the external device. The input/output device 3200 may be, for example, a keypad, a keyboard, or a display device.

The memory 3300 may store a code and/or data for operations of the controller 3100 therein, or may store data processed in the controller 3100. The memory 3300 may include a semiconductor device according to one of example embodiments of the present inventive concept.

The interface 3400 may be a data transmission path between the system 3000 and other external device. The controller 3100, the input/output device 3200, the memory 3300, and the interface 3400 may communicate with each other through a bus 3500. At least one of the controller 3100 or the memory 3300 may include a semiconductor device according to any of the aforementioned example embodiments described with reference to FIGS. 1 to 4, and FIG. 8.

As set forth above, according to example embodiments, different interconnect layers in a semiconductor device may respectively include an ultra-low dielectric constant material without a carbon-deficient region and an air spacing. Thus, a semiconductor device with improved electrical properties and reliability may be provided, along with a method of manufacturing for manufacturing such a device.

Example embodiments have been disclosed herein, and although specific terms are employed, they are used and are to be interpreted in a generic and descriptive sense only and not for purpose of limitation. The embodiments may be combined to form additional embodiments. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A semiconductor device comprising:
a substrate;
an element layer on the substrate;
a plurality of interconnect layers including a first interconnect layer and a second interconnect layer on the first interconnect layer; and
a plurality of insulating layers including a first insulating layer and a second insulating layer on the first insulating layer, the first insulating layer at least partially filling a first space in the first interconnect layer, the second insulating layer at least partially filling a second space in the second interconnect layer,
wherein:
a first air gap is in the second insulating layer,
the first insulating layer is formed of a dielectric constant material having a dielectric constant lower than a first value,
no air gap is formed in the first insulating layer, and
the first insulating layer has a non-uniform carbon concentration distribution such that portions of the first insulating layer proximate to the first interconnect layer have a carbon concentration lower than that of portions of the first insulating layer distal to the first interconnect layer.

2. The semiconductor device of claim 1, wherein:
the plurality of interconnect layers include a third interconnect layer below the first interconnect layer,
a plurality of insulating layers include a third insulating layer below the first insulating layer, the third insulating layer filling a third space in the third interconnect layer, and
the third insulating layer has a uniform carbon concentration distribution.

3. The semiconductor device of claim 2, further comprising a plurality of dielectric layers including a first dielectric layer and a second dielectric layer, the first dielectric layer being on an upper surface of the third interconnect layer and on a lateral surface of the third interconnect layer, the second dielectric layer being on an upper surface of the second interconnect layer.

4. The semiconductor device of claim 3, wherein a shape of the first dielectric layer is different from a shape of the second dielectric layer.

5. The semiconductor device of claim 1, wherein:
the plurality of interconnect layers include a third interconnect layer on the second interconnect layer,
a plurality of insulating layers include a third insulating layer on the second insulating layer, the third insulating layer filling a third space in the third interconnect layer, and
a second air gap is in the third insulating layer.

6. The semiconductor device of claim 1, wherein:
the first interconnect layer includes first interconnect lines and first contact plugs,
the second interconnect layer includes second interconnect lines and second contact plugs, and
each of the second contact plugs connects a corresponding one of the first interconnect lines and a corresponding one of the second interconnect lines.

7. The semiconductor device of claim 6, wherein a minimum distance between two adjacent second interconnect lines among the second interconnect lines is greater than a minimum distance between two adjacent first interconnect lines among the first interconnect lines.

8. The semiconductor device of claim 1, further comprising:
a first diffusion barrier layer on a lateral surface and a lower surface of the first interconnect layer; and
a second diffusion barrier layer on a lateral surface and a lower surface of the second interconnect layer.

* * * * *